(12) United States Patent  (10) Patent No.: US 11,735,015 B2
Silva et al.  (45) Date of Patent: Aug. 22, 2023

(54) MEASUREMENT DEVICES WITH VISUAL INDICATION OF DETECTED ELECTRICAL CONDITIONS

(71) Applicant: Fluke Corporation, Everett, WA (US)

(72) Inventors: Luis R. Silva, Lynnwood, WA (US); Brian Douglas Painting, Seattle, WA (US)

(73) Assignee: Fluke Corporation, Everett, WA (US)

( * ) Notice: Subject to any disclaimer, the term of this patent is extended or adjusted under 35 U.S.C. 154(b) by 131 days.

(21) Appl. No.: 17/231,903

(22) Filed: Apr. 15, 2021

(65) Prior Publication Data

US 2021/0327228 A1  Oct. 21, 2021

Related U.S. Application Data

(60) Provisional application No. 63/011,839, filed on Apr. 17, 2020.

(51) Int. Cl.
*G08B 5/36* (2006.01)
(52) U.S. Cl.
CPC ........................................ *G08B 5/36* (2013.01)
(58) Field of Classification Search
CPC ...................................................... G08B 5/36
See application file for complete search history.

(56) References Cited

U.S. PATENT DOCUMENTS

| | | |
|---|---|---|
| 4,027,236 A | 5/1977 | Stewart |
| 4,933,962 A | 6/1990 | Sanders |
| 5,561,365 A * | 10/1996 | Havel ..................... G09G 5/04 324/133 |
| 5,650,727 A | 7/1997 | Lapping et al. |
| 6,653,846 B2 | 11/2003 | James |
| 7,936,280 B2 * | 5/2011 | Hoetzel ................. G01R 31/67 340/815.45 |
| 8,590,146 B2 | 11/2013 | Kinsley |
| 10,139,435 B2 | 11/2018 | Steuer et al. |

(Continued)

FOREIGN PATENT DOCUMENTS

JP  2010-147734 A  7/2010

OTHER PUBLICATIONS

Extech Instruments, CT20 Datasheet "Continuity Tester Pro", www.extech.com, 2011, 1 pg.

(Continued)

*Primary Examiner* — Travis R Runnings
(74) *Attorney, Agent, or Firm* — Seed Intellectual Property Law Group LLP

(57) ABSTRACT

Systems, devices, and operating methods thereof provide for operation of a display based on detection of defined electrical conditions. Measurement devices may include a housing sized and shaped to be held in a hand, a set of sensor devices for sensing a set of electrical characteristics, processing circuitry, and a display supported by the housing. The measurement devices receive measurements obtained from the sensor devices and determine whether the measurements satisfy criteria for detecting defined electrical conditions in an element under test. Operating modes of the display having different corresponding illumination characteristics are controlled as a result of determining the presence of defined electrical conditions in the element under test.

18 Claims, 10 Drawing Sheets

(56) References Cited

U.S. PATENT DOCUMENTS

| | | | |
|---|---|---|---|
| 10,197,612 B2 | 2/2019 | Griffiths et al. | |
| 10,502,807 B2 | 12/2019 | Steuer | |
| 10,591,515 B2 | 3/2020 | Rodriguez et al. | |
| 2016/0084879 A1* | 3/2016 | Luo | G01R 15/18 |
| | | | 324/127 |
| 2016/0270191 A1* | 9/2016 | Ludwig, Jr. | H05B 47/19 |
| 2018/0136260 A1* | 5/2018 | Rodriguez | G01R 19/00 |
| 2018/0180648 A1* | 6/2018 | Carson | G08B 5/36 |
| 2019/0324062 A1* | 10/2019 | Brehm | G08B 5/36 |
| 2019/0346484 A1* | 11/2019 | Worones | G01R 15/14 |
| 2019/0385803 A1* | 12/2019 | Anderson | H01H 50/02 |
| 2020/0134989 A1* | 4/2020 | Gupta | G08B 3/10 |

OTHER PUBLICATIONS

Craftsman, "24V Circuit Tester—CMMT14103", https://www.craftsman.com/products/automotive-tools/automotive-specialty-tools/cmmt14103--24v-circuit-tester; downloaded Apr. 15, 2021, 7 pgs.
Grainger, "Westward Continuity Tester—1EKN7", https://www.grainger.com/product/WESTWARD-Continuity-Tester-1EKN7; downloaded Apr. 15, 2021, 1 pg.
European Search Report for Application No. EP 21168634.0 dated Aug. 20, 2021, 11 pgs.

\* cited by examiner

MEASUREMENT DEVICES WITH VISUAL INDICATION OF DETECTED ELECTRICAL CONDITIONS

BACKGROUND

Technical Field

The present disclosure relates to measurement of electrical characteristics and, more particularly, to measurement of electrical parameters in electric circuits.

Description of the Related Art

Digital multimeters (DMMs) and other similar instruments are operable to measure electrical characteristics to service, evaluate, troubleshoot, etc., circuits in the field. Such parameters may include alternating current (AC) voltage and current, direct current (DC) voltage and current, resistance, capacitance, power characteristics, and frequency, by way of non-limiting example.

Some instruments may indicate the presence or absence of certain conditions in a circuit. For example, some instruments may include a small light source on a body of the instrument that is illuminated in response to detection of a certain condition in a circuit. In some circumstances, however, illumination of such a light source may be insufficient to provide notice to an operator that the condition is detected. When used outdoors in sunny conditions or indoors in high intensity light conditions, it may be difficult for an operator to detect whether the light source is illuminated. Moreover, the light source may become inoperable due, e.g., to failure of the light or a disruption to the circuit supplying power to the light. The operator may be unaware of the inoperability of the light and may instead consider that the condition is not present in the circuit under test. In some industrial or environmental conditions, accumulation of certain materials (e.g., oil, dust) may occlude the light source and a status of the test may become unclear to an operator as a result.

As another example, some instruments may be equipped with an audio speaker that emits a tone, a beep, or other audio response in response to detection of continuity in a circuit. However, such audio responses may be inappropriate in certain settings (e.g., an office), as the audio responses may distract others in the vicinity of the instrument if the condition is detected. Audio responses may be difficult to hear in noisy environments or for operators with hearing disorders or disabilities to perceive. Certain audio responses may also be annoying to the operator, who may elect to discontinue the audio response mode before proceeding with testing.

BRIEF SUMMARY

Embodiments of the present disclosure include measurement devices and methods of operating a measurement device. The disclosure includes examples describing a variety of features that can be included, separately or in any combination, in such embodiments. The following examples in this brief summary are not exhaustive of all the features contemplated by the present disclosure and described in greater detail herein.

Various examples of a measurement device may include any one or combination of the following features: a housing; a housing sized and shaped to be held in a hand; a display; a display supported by the housing; one or more sensor devices for obtaining measurements; one or more sensor devices for obtaining measurements of electrical characteristics; processing circuitry; processing circuitry internal to the housing; processing circuitry operatively coupled to the display; processing circuitry operatively coupled to the one or more sensor devices; processing circuitry configured to operate in a measurement mode for detecting one or more defined electrical conditions; processing circuitry, in the measurement mode, configured to operate the display in a first operating mode; processing circuitry configured to receive a first set of measurements obtained via the one or more sensor devices; processing circuitry configured to determine whether the first set of measurements satisfies a first set of criteria for detecting a first electrical condition in an element under test; processing circuitry that, as a result of determining that the first set of measurements satisfies the first set of criteria, is configured to transition the operation of the display from the first operating mode to a second operating mode; operation of the display in second operating mode having different illumination characteristics than operating in the first operating mode; the display having a first luminance in the first operating mode and a second luminance in the second operating mode; the second luminance being different than the first luminance; the display emitting light of a first color in the first operating mode and emitting light of a second, different color in the second operating mode; the display intermittently emitting light in the second operating mode different than in the first operating mode; the display not emitting light in the first operating mode and emitting light in the second operating mode.

Various examples of a measurement device may also include any one or combination of the following features: processing circuitry, operating in the measurement mode, configured to receive a second set of measurements obtained via the one or more sensor devices; processing circuitry configured to receive a second set of measurements via the one or more sensor devices at a time subsequent to receiving the first set of measurements; processing circuitry configured to determine whether the second set of measurements satisfies a second set of criteria for detecting a second electrical condition in the element under test; processing circuitry that, as a result of determining that the second set of measurements satisfies the second set of criteria, is configured to transition the operation of the display from the second operating mode to a third operating mode; the third operating mode having different illumination characteristics than the second operating mode; processing circuitry, operating in the measurement mode, configured to receive a second set of measurements obtained via the one or more sensor at a time subsequent to receiving the first set of measurements; processing circuitry configured to determine whether the second set of measurements satisfies the first set of criteria for detecting the first electrical condition in the element under test; processing circuitry that, as a result of determining that the second set of measurements fails to satisfy the first set of criteria, is configured to transition the operation of the display from the second operating mode to the first operating mode; processing circuitry, in the measurement mode, configured to receive a first measurement of an electrical characteristic obtained via a first sensor device of the one or more sensor devices; processing circuitry configured to receive a second measurement of the electrical characteristic obtained via a second sensor of the one or more sensor devices; the second measurement being obtained in connection with the first measurement; processing circuitry configured to calculate a difference between the first measurement and the second measurement; processing circuitry configured to determine whether the difference is within a range of values of the first set of criteria; the display is transitioned from the first operating mode to the second operating mode as a result of the difference being within the range of values.

As described herein, the one or more sensor devices of the measurement device may include one or more sensors configured to sense a set of electrical characteristics of an electric signal in the element under test without galvanically contacting the element under test. The one or more sensor devices of the measurement device may include one or more terminals for selective connection and disconnection of one or more test probes that are configured to sense a set of electrical characteristics of an electric signal in the element under test.

Additional examples of a measurement device may include any one or combination of the following features: a set of sensor devices; a display; a memory; a processor operatively coupled to the display, the memory, and the set of sensor devices. In various examples, the processor of the measurement device may be configured to: obtain, from the memory, condition data for detecting defined electrical conditions; obtain, from the memory, operating mode data for operating the display based on detection of one or more of the defined electrical conditions; receive a first set of measurements of electrical characteristics from the set of sensor devices; determine whether the first set of measurements satisfies a first criterion specified in the condition data for a first defined electrical condition of the defined electrical conditions; as a result of the first set of measurements satisfying the first criterion, operate the display in a first operating mode specified in the operating mode data, the first operating mode associated with detection of the first defined electrical condition; receive a second set of measurements of electrical characteristics from the set of sensor devices; determine whether the second set of measurements satisfies a second criterion specified in the condition data for a second defined electrical condition of the defined electrical conditions; as a result of the second set of measurements satisfying the second criterion, operate the display in a second operating mode specified in the operating mode data, the second operating mode associated with the second defined electrical condition. In various examples, the display of the measurement device may have first illumination characteristics in the first operating mode and may have second illumination characteristics in the second operating mode that is different than the illumination characteristics in the first operating mode.

Various examples of a method of operating a measurement device may include any one or combination of the following features: operating, by the measurement device, a display screen in a first operating mode; receiving, by the measurement device, a first set of measurements of an electrical characteristic of an element under test; receiving, by the measurement device, a first set of measurements of an electrical characteristic of an element under test, wherein the first set of measurements is obtained during a first time period by a set of sensors coupled to the measurement device; detecting, by the measurement device, a presence of a first defined electrical condition in the element under test based on a relationship of the first set of measurements, or a measurement result generated therefrom, to a first defined set of criteria; as a result of detecting the presence of the first defined electrical condition, operating, by the measurement device, the display screen in a second operating mode associated with the first defined electrical condition; said operating the display screen in the second operating mode includes causing the display screen to have a different illumination characteristics during operation in the second operating mode than during operation in the first operating mode. In various examples, the first defined electrical condition may be electrical continuity between a first test point in the element under test and a second test point in the element under test, and the first defined set of criteria includes a first range of resistance values. The electrical characteristic may be a voltage or a current.

Various examples of a method of operating a measurement device may also include any one or combination of the following features: receiving, by the measurement device, a second set of measurements of the electrical characteristic; receiving, by the measurement device, a second set of measurements of the electrical characteristic obtained during a second time period by the set of sensors; detecting, by the measurement device, a presence of a second defined electrical condition in the element under test based on a relationship of the second set of measurements, or a measurement result generated therefrom, to a second defined set of criteria; as a result of detecting the presence of the second defined electrical condition, operating, by the measurement device, the display screen in a third operating mode associated with the second defined electrical condition; said operating the display screen in the third operating mode includes causing the display screen to have a different illumination characteristics during operation in the third operating mode than during operation in the second operating mode. In various examples, the measurement result may be a resistance measurement generated based on a calculation involving the first set of measurements, and the first defined electrical condition is an electrical continuity in the element under test detected as a result of the resistance measurement satisfying the first defined set of criteria.

BRIEF DESCRIPTION OF THE SEVERAL VIEWS OF THE DRAWINGS

In the drawings, identical reference numbers identify similar elements or acts. The sizes and relative positions of elements in the drawings are not necessarily drawn to scale. For example, the shapes of various elements and angles are not necessarily drawn to scale, and some of these elements may be arbitrarily enlarged and positioned to improve drawing legibility. Further, the particular shapes of the elements as drawn, are not necessarily intended to convey any information regarding the actual shape of the particular elements, and may have been solely selected for ease of recognition in the drawings.

DETAILED DESCRIPTION

Figure 1:
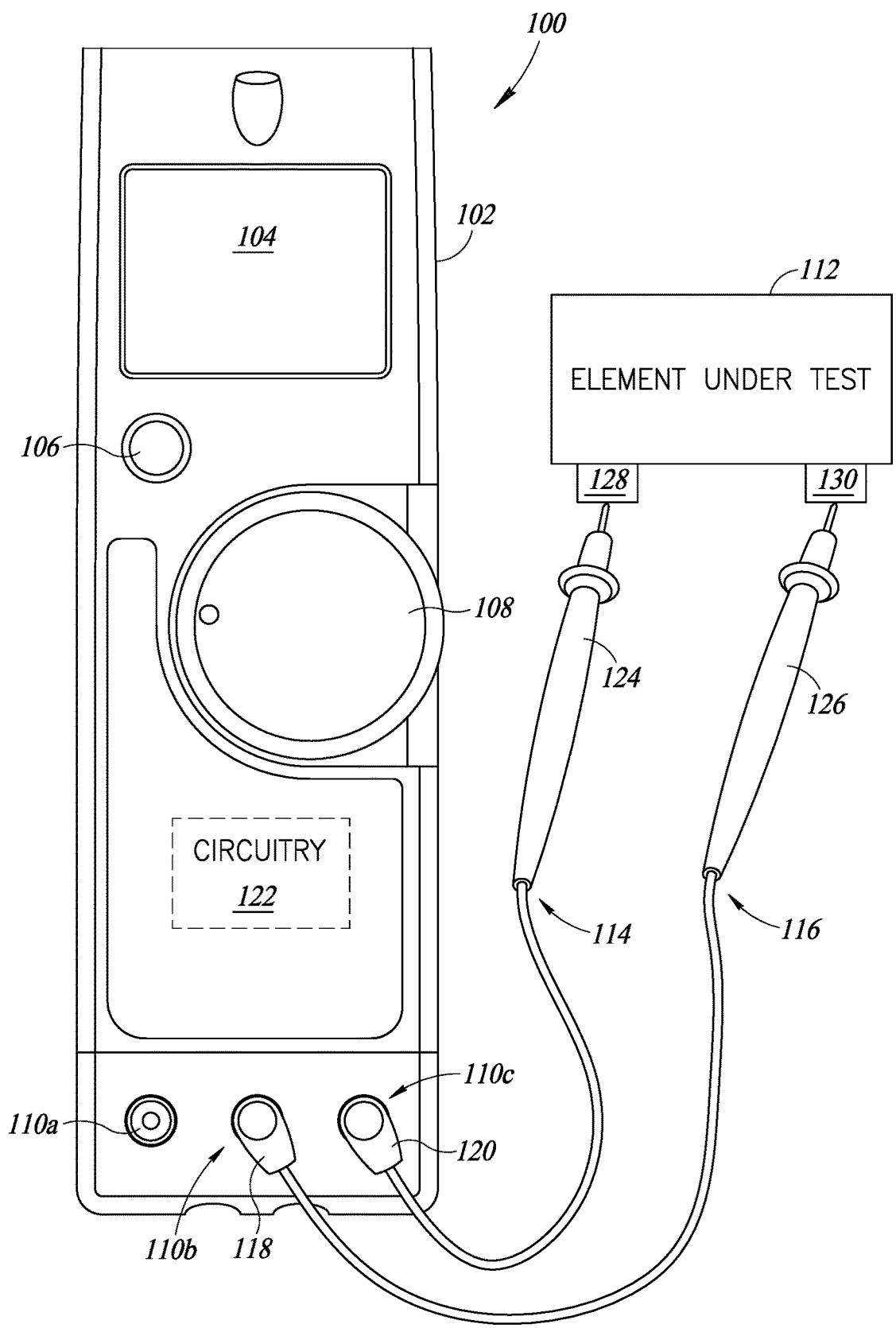
FIG. 1 is a front view of an environment in which an example measurement system is implemented incorporating at least some features of the present disclosure.

Systems and methods of the present disclosure provide for detection, by a measurement device, of the presence of a defined electrical condition in an electrical system, or element under test, and cause a display of the measurement device to transition between operating modes as a result of detection of the electrical condition. In each operating mode, the display has a corresponding different illumination characteristic that informs a user of the measurement device of a detection status of the test being performed on the element under test.

For example, the illumination characteristic may be a luminance of the display, such as an amount of light or an intensity of light that is emitted from or reflected by the display. In such case, in different operating modes, the measurement device may cause the display to have a different luminance. As another example, the illumination characteristic may be a color of light emitted from or reflected by the display. In such case, the measurement device may cause the display to emit or reflect light of a first color in the first operating mode, and to emit or reflect light of a different, second color in the second operating mode. As another example, the illumination characteristic may be a period of time in which light is emitted or reflected, or not emitted or reflected, by the display. In such case, the measurement device may cause the display to intermittently emit or reflect light in the second operating mode different than the manner in which the display emits or reflects light in the first operating mode. In one example, light emitted or reflected by the display in the second operating mode may flash on and off, while in the first operating mode, light may be constantly emitted or reflected (or not emitted or reflected) by the display. In another example, the display in the second operating mode may intermittently emit or reflect light according to a frequency or duty cycle that is different than light emitted or reflected by the display in the first operating mode.

The illumination characteristic corresponding to each operating mode is not an alphanumeric or symbolic indication of a specific measurement shown on the display, such as a numeric value of a measurement obtained by the measurement device. Rather, the illumination characteristic as described and claimed herein is an aspect of general illumination of the display, preferably the entirety thereof. For example, the illumination characteristic may be a luminance, color, or timing of illumination of general background lighting of the display. In some cases, the general background lighting may be reflected light that passes through one or more filters controlled by the display, e.g., as employed in an LCD display. In some cases, the general background lighting may be produced by light emitting elements controlled by the display, e.g., as employed in an LED, OLED, or plasma display, or by backlighting as employed in a backlit LCD display. In various embodiments, the illumination characteristic of the display as described herein may indicate a range of values of a measurement or set of measurements without reporting a specific measurement value. In such embodiments, the illumination characteristic of the display may indicate a range of measurement values that encompasses measurement values obtained by the measurement device, but the illumination characteristic is not an alphanumeric or symbolic representation of a specific measurement value in the range of measurement values.

As a result of transitioning the display from one operating mode having a particular illumination characteristic to another operating mode having a different particular illumination characteristic, the measurement device conspicuously informs the user of the detection (or non-detection) of a defined condition in the element under test. Embodiments of the disclosure thus address the earlier-mentioned problems of conventional measurement devices that use a small light source such as a single LED, or an audio source, to indicate the presence or absence of a certain condition in an element under test. With conventional measurement devices, illumination of a small, single light may be insufficient to inform the user that the condition is detected, e.g., when such conventional devices are used outdoors in sunny conditions or indoors in high intensity light conditions (where it may be difficult for the user to see if the light is illuminated), or when the light has become inoperable, e.g., due to failure of the light or other circuit disruption, or when materials such as oil or dust have accumulated and occluded the light such that the status of the test becomes unclear. In contrast, with embodiments of the present disclosure, by varying the general illumination of the display according to different illumination characteristics of the different operating modes, the detection status of the test being performed is readily observable in various environmental conditions. The different illumination characteristics of the display inform the user of the detection status even when the user is not looking directly at the display.

An element under test may in some cases be a single electrical component, and in other cases an element under test may be multiple components forming an electrical system. The measurement devices disclosed herein may include a set of one or more sensors or a set of terminals for connection of one or more sensors that sense electrical characteristics of an electric signal in the element under test, for example an insulated wire, and one or more processors that receive measurements from the set of sensors. The set of sensors may include a voltage sensor that is configured to generate voltage measurement signals indicative of voltage in the insulated wire, and may include a current sensor that is configured to generate current measurement signals indicative of current in the insulated wire. In some cases, the respective sensors may generate one or more measurement signals during a common or overlapping measurement time period, which may be relatively short in duration (e.g., 10 milliseconds (ms), 100 ms, 1 second, 10 seconds). For example, the voltage measurement signals and the current measurement signals may be obtained at least partially concurrent with each other. As another example, one of the voltage sensor and the current sensor may obtain a measurement substantially immediately after the other of the voltage sensor and the current sensor obtains a measurement, such that the measurements are obtained at nearly the same time and within a common measurement time interval. In some implementations, the voltage sensor and current sensor may be operative to repeatedly obtain measurements at specified intervals (e.g., every 10 ms, every 100 ms, every 1 second, every 10 seconds). In some cases, the voltage and current sensors both obtain their respective measurements within a measurement time interval that is sufficiently short such that pairs of the voltage and current measurements correspond to each other. The measurement signals generated by the set of sensors, such as voltage and current measurement signals, may be used to derive additional measurement signals, such as a resistance measurement signal.

As a result of obtaining the set of measurements from the set of sensors, the one or more processors are configured to perform an evaluation of electrical characteristics to detect the presence of a defined electrical condition. The one or more processors may calculate one or more values for or relating to the electrical characteristics using the set of measurements and determine whether the values satisfy a set of criteria that define the electrical condition. A set of criteria as used herein may include a single criterion or multiple criteria. The one or more processors, as a result of detecting the defined electrical condition in the element under test, may cause a display of the measurement device to transition between operating modes. By way of non-limiting example, the one or more processors may cause the display device to transition from one mode to a different mode of illumination level, color display, display pattern, etc., as a result of detecting the presence of the defined electrical condition in the element under test.

Beneficially, the measurement device provides a quick indication that an electrical condition corresponding to the defined set of criteria is detected as being present in the element under test. Accuracy and/or precision in a user's recognition of the detected electrical condition in real-time may be improved as a result of transitioning a mode of display of the measurement device. In comparison to some solutions in which a single light or an audio tone is activated in response to detection of a condition, the measurement device of the present disclosure transitions a display device thereof from a first operating mode to a second operating mode to facilitate certain and unobtrusive indication, readily observed by a user, that the electrical condition was detected. Moreover, in various embodiments, the measurement device has a hand-held form factor that is portable and does not require access to a power outlet for operation. Further, the measurement device herein may be operated by a technician in the field without significant training or supervision.

The following description, along with the accompanying drawings, sets forth certain specific details in order to provide a thorough understanding of various disclosed embodiments. However, one skilled in the relevant art will recognize that the disclosed embodiments may be practiced in various combinations, without one or more of these specific details, or with other methods, components, devices, materials, etc. In other instances, well-known structures or components that are associated with the environment of the present disclosure, including but not limited to the communication systems and networks and the environment, have not been shown or described in order to avoid unnecessarily obscuring descriptions of the embodiments. Additionally, the various embodiments may be methods, systems, media, or devices. Accordingly, the various embodiments may be entirely hardware embodiments, or embodiments combining software and hardware aspects.

Before discussing the details of the present disclosure, it is also beneficial to note that throughout the specification, claims, and drawings, the following terms take the meaning explicitly associated herein, unless the context clearly dictates otherwise. The term "herein" refers to the specification, claims, and drawings associated with the current disclosure. The phrases "in one embodiment," "in another embodiment," "in various embodiments," "in some embodiments," "in other embodiments," and other variations thereof refer to one or more features, structures, functions, limitations, or characteristics of the present disclosure, and are not limited to the same or different embodiments unless the context clearly dictates otherwise. As used herein, the term "or" is an inclusive "or" operator, and is equivalent to the phrases "A or B, or both" or "A or B or C, or any combination thereof," and lists with additional elements are similarly treated. The term "based on" is not exclusive and allows for being based on additional features, functions, aspects, or limitations not described, unless the context clearly dictates otherwise. In addition, throughout the specification, the meaning of "a," "an," and "the" include singular and plural references.

References to the term "set" (e.g., "a set of items"), as used herein, unless otherwise noted or contradicted by context, is to be construed as a nonempty collection comprising one or more members or instances.

Unless the context requires otherwise, throughout the specification and claims that follow, the word "comprising" is synonymous with "including," and is inclusive or open-ended (i.e., does not exclude additional, unrecited elements or method acts). Additionally, reference throughout this specification to "one implementation" or "an implementation" means that a particular feature, structure or characteristic described in connection with the implementation is included in at least one implementation. Thus, the appearances of the phrases "in one implementation" or "in an implementation" in various places throughout this specification are not necessarily all referring to the same implementation. Furthermore, the particular features, structures, or characteristics may be combined in any suitable manner in one or more implementations. In addition, the headings and Abstract of the Disclosure provided herein are for convenience only and do not interpret the scope or meaning of the implementations.

FIG. 1 illustrates an electrical parameter measurement system (or "measurement system") according to an embodiment of the present disclosure. It should be noted that, in the embodiment of FIG. 1, the measurement system includes a measurement device 100 shown as a portable digital multimeter (DMM). In other embodiments of the present disclosure, the measurement device 100 may be a portable analog multimeter, an electrical tester, a desktop digital or analog multimeter, a clamp meter, a portable oscilloscope ("scope meter"), a desktop oscilloscope, or any other suitable measurement device.

As shown in FIG. 1, the measurement device 100 includes a housing 102 that supports a display 104 such as a display screen, one or more manually operable buttons 106, and a rotatable measurement mode selector switch 108. In some embodiments, the measurement device 100 may include other types of user input interfaces, for example, a touch screen or a touch panel. The measurement device 100 includes multiple input terminals 110a, 110b, 110c (collectively input terminals 110) for electrical connection of sensors or probes to measure electrical parameters of an element under test ("EUT") 112. A first sensor device 114 and a second sensor device 116 respectively include plugs 118 and 120. The plugs 118 and 120 are selectively insertable into and removable from individual ones of the input terminals 110 of the measurement device 100. The input terminals 110 are connected to an internal circuitry 122 contained within the housing 102, which includes processing circuitry and may include signal conditioning circuitry. The first and second sensor devices 114 and 116 shown in FIG. 1 are test leads or probes with electrically conductive tips for electrical measurement, but the first and second sensor devices 114 and 116 may be any devices that are configured to provide electrical signals to the internal circuitry 122 for measurement of electrical characteristics of the EUT 112.

The display 104 includes an array of display elements arranged in rows and columns on or within a surface of the housing 102. Individual elements or groups of display elements may operate based on signals provided by the internal circuitry 122. In some embodiments, the display 104 includes multiple lighting elements, such as light emitting diodes (LEDs) or electroluminescent elements including a dot matrix display, that can be selectively controlled to emit light or emit light having a desired illumination level, desired flashing pattern, desired color, etc. In some embodiments, the display 104 may include a backlight portion and multiple light modulation elements overlaying the backlight portion, such as a liquid crystal display (LCD). The backlight portion or the light modulation elements may be selectively controllable to adjust certain characteristics of the light emitted or reflected by the display, such as an illumination level or color. The display 104 may include other known display elements or have different structures of display elements than the foregoing structures without departing from the scope of the present disclosure.

The internal circuitry 122 is configured to operate the display 104 in a plurality of operating modes when the measurement device 100 is in an active powered-on state in which the internal circuitry 122 operates to process measurements. The active powered-on state is distinguishable from a low-power or sleep mode in which the measurement device 100 is operated in a reduced-power consumption mode. The internal circuitry 122 transitions the display 104 between operating modes in certain measurement modes of the measurement device 100. The display 104 may have certain illumination characteristics based on the operating mode implemented by the internal circuitry 122. The illumination characteristics of the display in the different operating modes do not depend on whether actual measurements (e.g., numeric values or waveforms) are shown (or not shown) on the display. For example, the display 104 may display different levels, amounts, or intensity of illumination, different colors, or different flashing patterns based on the particular operating mode being implemented. Each operating mode may provide an operator with a conspicuous visible indication regarding whether a defined condition is present in an element under test 112 being tested. In the illustrated example, some of the input terminals 110 are provided as inputs for measuring various electrical characteristics, such as resistance, voltage, current, capacitance, and frequency, by way of non-limiting example. Some of the input terminals 110 may be reference or common input terminals. A position of the selector switch 108 is adjustable to select between various electrical parameters to be measured. One or more positions of the selector switch 108 may cause the measurement device 100 to detect whether a defined condition is satisfied, such as whether continuity is provided between various nodes of the EUT 112.

The first and second sensor devices 114 and 116 further include a first test probe 124 and a second test probe 126, respectively. The first and second test probes 124 and 126 are selectively connectable to test points 128 and 130 of the EUT 112, which may be different points in a circuit, conductor, or electrical system. Thus, the EUT 112 can be electrically connected to the internal circuitry 122 through the first and second sensor devices 114 and 116. The internal circuitry 122 of the measurement device 100 is operative to perform the various measurements discussed herein based on electrical signals delivered through the first and second sensor devices 114 and 116 to generate measurement results. In some embodiments, internal circuitry 122 may cause the display 104 to transition between operating modes based on the measurement results.

Figure 2:
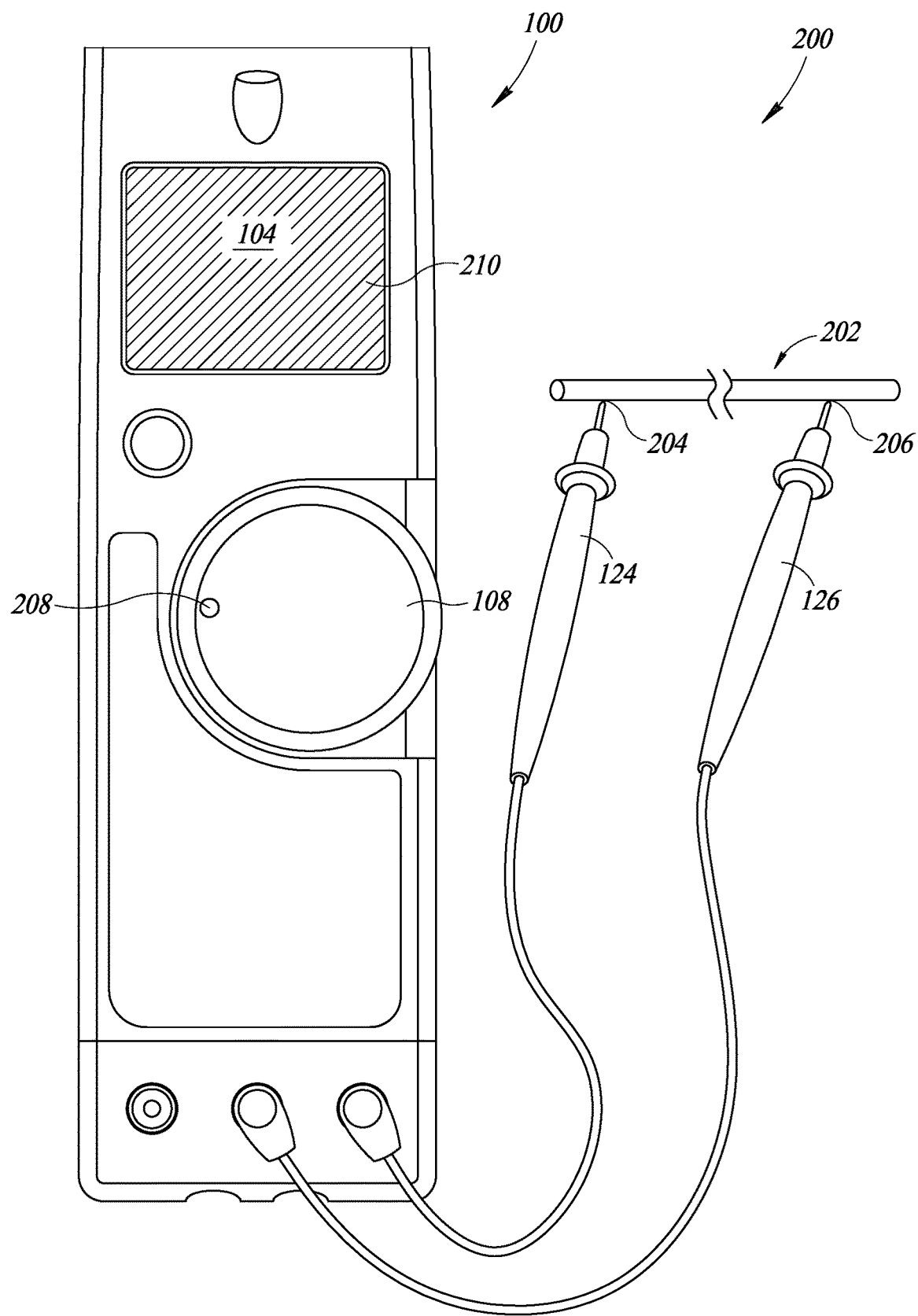
FIG. 2 is a front view of the measurement system of FIG. 1 having a display operating in a first operating mode.

FIG. 2 shows an environment 200 in which the measurement device 100 is operated to detect the presence of a defined condition in an element 202 being tested. The element 202 may be a particular portion, circuit, electrical element, etc., of an electrical system to be tested by an operator. As a particular example, the measurement device 100 is operated to perform a continuity test of the element 202. In particular, the measurement device 100 is operated to detect whether there is electrical continuity between a first test point 204 of the element 202 and a second test point 206 of the element 202 based on a set of measurements pertaining to the electrical characteristic to be tested.

Detection of continuity between the first and second test points 204 and 206 may be confirmed as a result of a determination by the measurement device 100 that an ohmic resistance between the first and second test points 204 and 206 is within a certain range. The measurement device 100, for instance, may be configured to determine electrical continuity in the element 202 as a result of sensing that an ohmic resistance value between the first and second test points 204 and 206 is between a first defined value and a second defined value. As a non-restrictive example, the first defined value may be zero ohms and the second defined value may be 75 ohms. However, other defined values for the first defined value or the second defined value may be selected based on the particular device or the particular application. The first defined value may be a value greater than zero ohms in some implementations. The second defined value may be a value different than 75 ohms in some implementations (e.g., 50 ohms, 100 ohms). The measurement device 100 may be configured to detect the presence of other electrical conditions in the element 202 based on one or more measurements of electrical characteristics (e.g., voltage, capacitance, current) relative to other defined ranges, as described elsewhere herein.

The mode selector switch 108 of the measurement device 100 is rotated such that a selection indicator 208 is pointed to or adjacent to a corresponding target mode indicator corresponding to a continuity testing mode in which the measurement device 100 may be operated to detect a continuity condition in the element 202. To determine whether the defined condition (e.g., electrical continuity) is present in the element 202, an operator using the measurement device 100 may position the first test probe 124 to be in contact with the first test point 204 and position the second test probe 126 to be in contact with the second test point 206. The first test point 204 is a first node or location in the element 202 and the second test point 206 is a second node or location and the element 202 separate from the first test point 204. At a first time or over a first time period, the first test probe 124 in contact with the first test point 204 obtains a first measurement and the second test probe 126 in contact with the second test point 206 obtains a second measurement.

The internal circuitry 122 receives the first measurement via one or more terminals of the input terminals 110 connected to the first test probe 124 and receives the second measurement via one or more other terminals of the input terminals 110 connected to the second test probe 126. The internal circuitry 122 may process the first and second measurements to produce a processed result and compare the processed result with a defined set of criteria related to an electrical condition to be detected in the element 202.

Using the aforementioned non-restrictive example of continuity testing, the internal circuitry 122 may determine a difference between a first measurement of the first test point 204 and a second measurement of the second test point 206. The first measurement and the second measurement for continuity testing may be voltages determined as a result of the measurement device 100 applying a current between the first and second test points 204 and 206 via the first and second test probes 124 and 126, respectively.

For the particular setting of the selector switch 108 (or other input to the measurement device 100), the defined criteria for detecting continuity may be a fixed range of values. As a particular example of the measurement device 100, the internal circuitry 122 may calculate a resistance between the first test point 204 and the second test point 206 based on a relationship between the current applied and the first and second voltage measurements and compare the calculated resistance with a defined range of resistance values representing the set of criteria that indicate the detection of continuity. In some embodiments, the defined set of criteria may be selectively adjustable by a user to detect the presence of a certain condition.

As a particular example described with respect to the environment 200 shown, the measurement device 100 may determine that the set of measurements does not satisfy the criteria of the defined condition. In this case, the internal circuitry 122 may determine that a resistance of the element 202 between the first test point 204 and the second test point 206 is not within a defined range of values relevant to the defined electrical condition being tested. As an example, for electrical continuity, the measurement device 100 may determine whether a measured resistance between the first and second test points 204 and 206 is within a defined range of resistance values. Those of ordinary skill in the art will appreciate that other electrical characteristics of an element being tested may be evaluated relative to certain defined ranges to detect the presence of conditions other than electrical continuity. For instance, a higher range of resistance values may be used to detect electrical insulation between the first and second test points 204 and 206. Defined ranges for other electrical characteristics, such as voltage, current, or frequency, may be used to detect other electrical conditions of interest.

In response to determining that the set of measurements does not satisfy the criteria of the defined condition, the internal circuitry 122 causes the display 104 to operate, or continue operating, in a first operating mode 210. In the first operating mode 210, the display 104 is operated to have a first set of display characteristics, for example, a first luminance level (e.g., brightness), a first color, or a first display pattern (e.g., flashing pattern). In the first operating mode 210, the display 104 may have the first set of display characteristics and not present information regarding the electrical characteristic being tested. In FIG. 2, in the first operating mode 210, the display 104 emits (or reflects) no light or is operated to have a low luminance level (e.g., less than 5 cd/m$^2$).

In some embodiments, the first operating mode 210 is one in which the display 104 emits (or reflects) light of a first color (e.g., white light, red light) and has a luminance level visible to an operator (e.g., between 200-700 cd/m$^2$). In some embodiments, the first operating mode 210 is one in which the display 104 may be controlled to have a flashing pattern in which the display 104 intermittently emits (or reflects) light, for example, alternating between a first period of emitting or reflecting light and a second period of no light emission or reflection. In the first operating mode 210, the display 104 may not display information regarding the electrical characteristic being tested. Other operating modes of the display 104 may be considered as being within the scope of operating in the first operating mode 210 disclosed herein.

Figure 3:
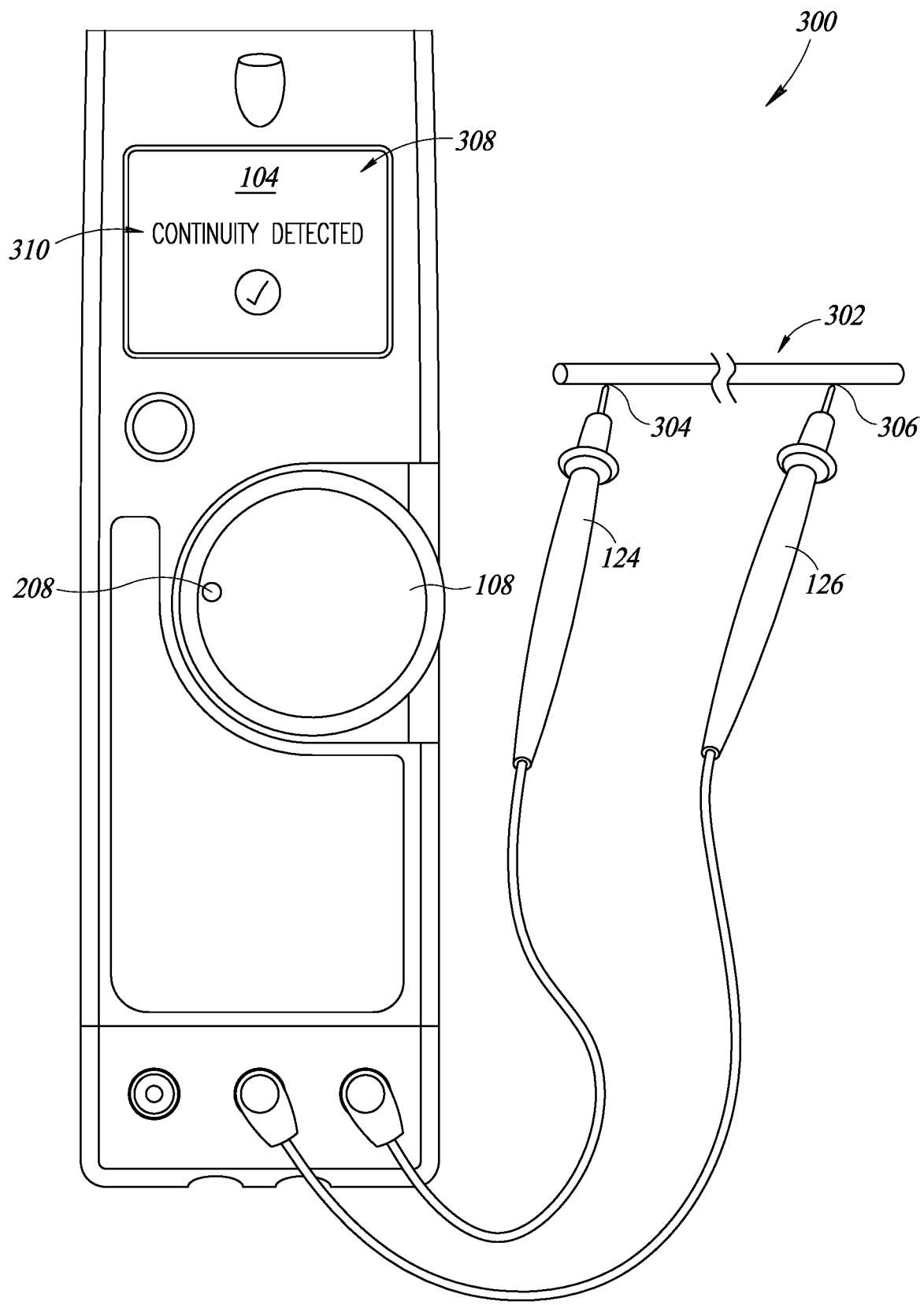
FIG. 3 is a front view of the measurement system of FIG. 1 having a display operating in a second operating mode.

FIG. 3 shows an environment 300 in which the measurement device 100 is operated to detect the presence of a defined condition in an element 302. In the environment 300, the measurement device 100 is operated to perform a continuity test of the element 302. In particular, the measurement device 100 is operated to detect whether there is electrical continuity between a first test point 304 of the element 302 and a second test point 306 of the element 302. Detection of continuity between the first and second test points 304 and 306 may be confirmed as a result of a determination by the measurement device 100 that an ohmic resistance between the first and second test points 304 and 306 is within a certain range, e.g., as described with respect to FIG. 2 and elsewhere herein.

The operator using the measurement device 100 positions the first test probe 124 to be in contact with the first test point 304 and position the second test probe 126 to be in contact with the second test point 306. At a time or over a time period, the first test probe 124 in contact with the first test point 304 obtains a first measurement and the second test probe 126 in contact with the second test point 306 obtains a second measurement. As described with respect to FIG. 2 and elsewhere, the internal circuitry 122 may determine a difference between the first and second measurements, such as a voltage drop, and calculate a resistance between the first test point 204 and the second test point 206 based on a relationship between the current applied and the voltage drop. The calculated resistance is compared with a defined range of resistance values representing the criteria that indicate a continuity condition.

As a result of determining that the set of measurements satisfy the condition associated with detection of continuity in the element 302, the internal circuitry 122 may transition the measurement device 100 from the first operating mode 210 to a second operating mode 308. In the second operating mode 308, the display 104 is operated to have a second set of display characteristics different than the first set of display characteristics of the first operating mode 210. By way of example, the display 104 operating in the second operating mode 308 may have a second luminance level that is greater than the first luminance level of the first operating mode 210. As another example, the display 104 operating in the second operating mode 308 may emit or reflect light of a second color different than the first color, such as green light or blue light.

In some embodiments, the display 104 operating in the second operating mode 308 may also display information regarding the electrical characteristic being tested, for instance, a measured resistance value of the element 302 between the first and second test points 304 and 306. The internal circuitry 122 may cause the display 104 to present a visual indication 310, such as a message or picture, indicating that the defined condition for detection of continuity is detected.

As a result of transitioning the display 104 to the second operating mode 308 from the first operating mode 210, the measurement device 100 provides a conspicuous indication that a particular defined condition is detected in the element 302 and not detected in the element 202. The first and second operating modes 210 and 308 of the display 104 provide clear indications regarding detected electrical characteristics that are visible and recognized in various lighting conditions. Additionally, the operator may be informed of a detection status of the test being performed based on a brightness or color of the light produced by the display 104 without looking directly at the display 104.

The characteristics of the first operating mode 210 may correspond to detection settings or operating mode data stored in memory of the measurement device 100. In some embodiments, the detection settings or operating mode data may be adjustable by the operator such that at least one or both of the first operating mode 210 and the second operating mode 308 have user-selected display characteristics. For example, the user may set the display to have a defined illumination when operating in the first operating mode 210 and a different defined illumination when operating in the second operating mode 308. Beneficially, the operator may adjust the display characteristics of the first operating mode 210 or the second operating mode 308 according to the environmental conditions in which testing of electrical elements (systems, devices, components, etc.) is to be performed. For example, when under standard indoor lighting conditions, the user may set the display characteristics to use different colors when illuminating the display in the first and second operating modes 210, 308, and when outdoors in the sun or under higher intensity lighting conditions, the user may set the display characteristics to use a different flashing pattern when illuminating the display in the first and second operating modes 210, 308.

Although the defined condition detected in the environments 200 and 300 is continuity between test points, the scope of the present disclosure is not so limited. Transitioning of the display 104 between different operating modes may be based on defined conditions for other electrical characteristics as well. By way of example, transitioning of the display 104 may be based on conditions for capacitance, inductance, frequency, AC voltage, AC current, DC voltage, DC current, conductance, magnetic field characteristics, and diode operation. Additionally, measurement devices may be configured to detect the presence of multiple defined conditions greater in number than two for a given electrical characteristic. In such implementations, the measurement devices are configured to control an operating mode of the display of the measurement device to transition between a corresponding number of operating modes based on which of the plurality of defined conditions is detected. For example, detecting a resistance within a first range of values may cause the measurement device to operate the display in a first operating mode, while detecting a resistance within a second range of values may cause operation of the display in a second operating mode different from the first operating mode, and detecting a resistance within a third range of values may cause operation of the display in a third operating mode different from the first and second operating modes.

The illumination characteristic of the display 104 that changes from the first operating mode to the second mode, and from the second operating mode to the third operating mode, is not an alphanumeric or symbolic representation of specific information such as a measurement value or a measurement waveform shown on the display. The illumination characteristic that changes is a general illumination of the entire display 104 or a portion thereof. As noted above, for example, a luminance of the display 104 (such as an amount of light or an intensity of light that is emitted or reflected by the display) may change when transitioning from one operating mode to another operating mode. The measurement device may cause the display 104 to have a first luminance in the first operating mode, and a second luminance in the second operating mode, in which the second luminance is different than the first luminance. As another example, the illumination characteristic may be a color of light emitted or reflected by the display 104. The measurement device may cause the display 104 to emit or reflect light of a first color in the first operating mode, and to emit or reflect light of a second color in the second operating mode, in which the second color is different than the first color. As another example, the illumination characteristic may be a period of time in which light is emitted or reflected, or not emitted or reflected, by the display 104. The measurement device may cause the display 104 to intermittently emit or reflect light in the second operating mode in a manner different than the emission or reflection of light in the first operating mode. In one example, light emitted or reflected by the display 104 in the second operating mode may flash on and off, while in the first operating mode, light may be constantly emitted or reflected, or not emitted or reflected, from the display. In another example, the display 104 in the second operating mode may intermittently emit or reflect light according to a frequency or duty cycle different than light emitted or reflected by the display in the first operating mode. Any one or combination of these examples of illumination characteristics may be used in the various embodiments of the present disclosure.

Figure 4:
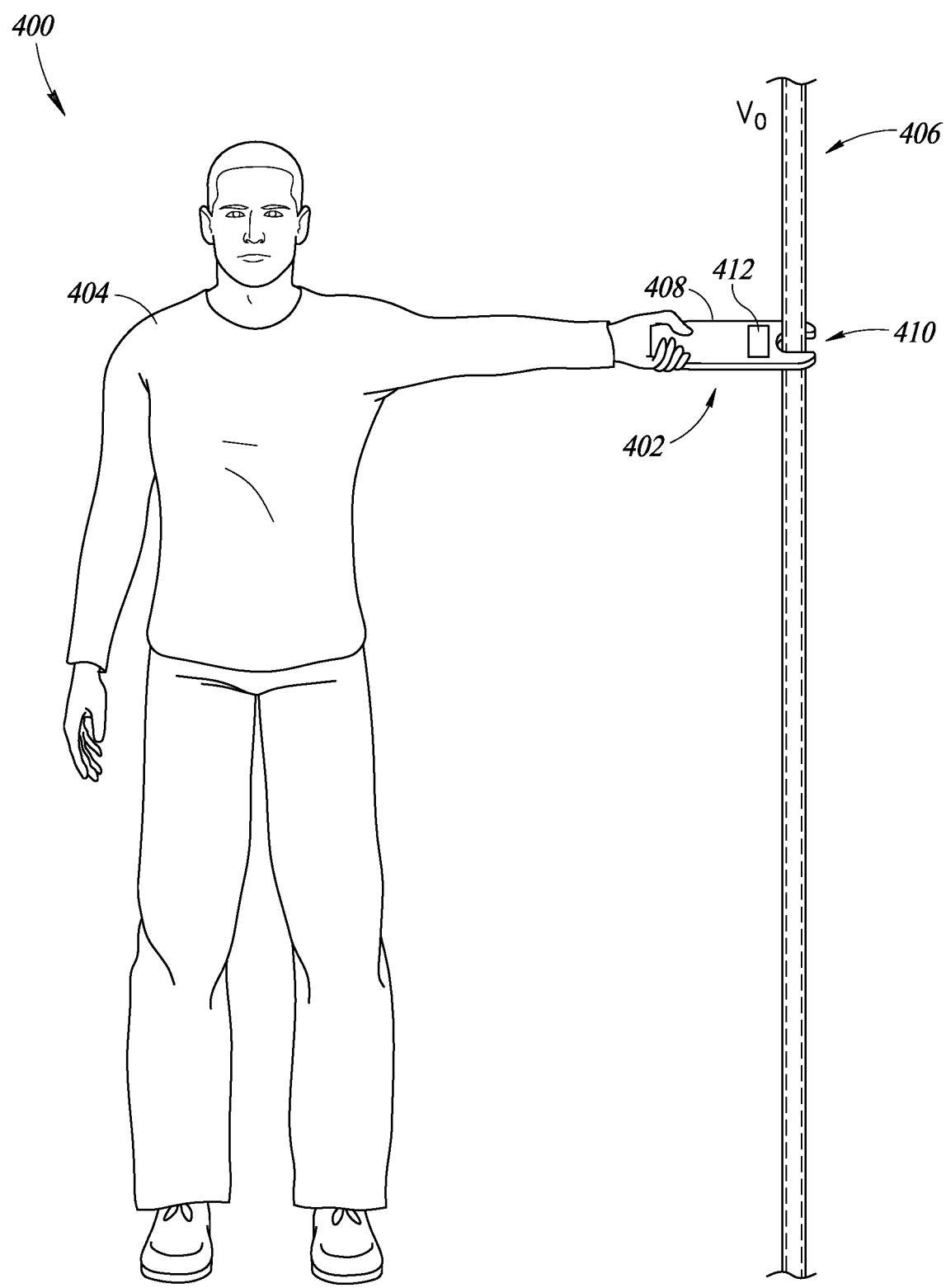
FIG. 4 is an environment in which a measurement device is implemented to measure electrical characteristics of an element under test according to one or more embodiments.

The measurement device 100 is configured for performing measurements of an element (e.g., a component, device, or system) via direct contact between a test probe and the test point. In some embodiments, the measurement device may be configured to detect electrical characteristics in a non-contact manner. FIG. 4 shows an environment 400 in which an operator 404 implements a non-contact measurement device 402 to measure electrical characteristics of an electric signal present in an insulated element 406, such as an insulated wire, without requiring galvanic contact between the non-contact measurement device 402 and the insulated element 406. In operation, the operator 404 may grasp a housing 408 of the measurement device 402 and position the insulated element 406 (e.g., wire) adjacent to a sensing portion 410, which may have a recessed shape, a hooked shape, a V-shape, or other shape for measuring electrical characteristics of a signal present in the insulated element 406. The operator 404 may initiate a measurement procedure by interacting with a user interface of the measurement device 402, which may include buttons, dials, rockers, or touchscreen features. The measurement device 402 includes a display 412 having various operating modes selected based on a result of noncontact measurements obtained using the sensing portion 410. As described herein, internal circuitry of the measurement device 402 controls an operating mode of the display 412 based on whether a set of measurements obtained by the sensing portion 410 satisfy a defined condition related to an electrical characteristic.

The term "non-contact," as used herein, refers to a non-galvanic contact (or "non-contact") measurement device in which electrical characteristics of an element to be tested can be measured without direct galvanic contact between the element to be tested and sensors, test probes, etc., to obtain measurements. For example, the measurement device 402 is configured to measure an AC voltage signal in an insulated conductor with respect to ground using one or more capacitive sensors without contacting the insulating conductor. Such systems which do not require a galvanic connection are referred to herein as "non-contact."

Figure 5:
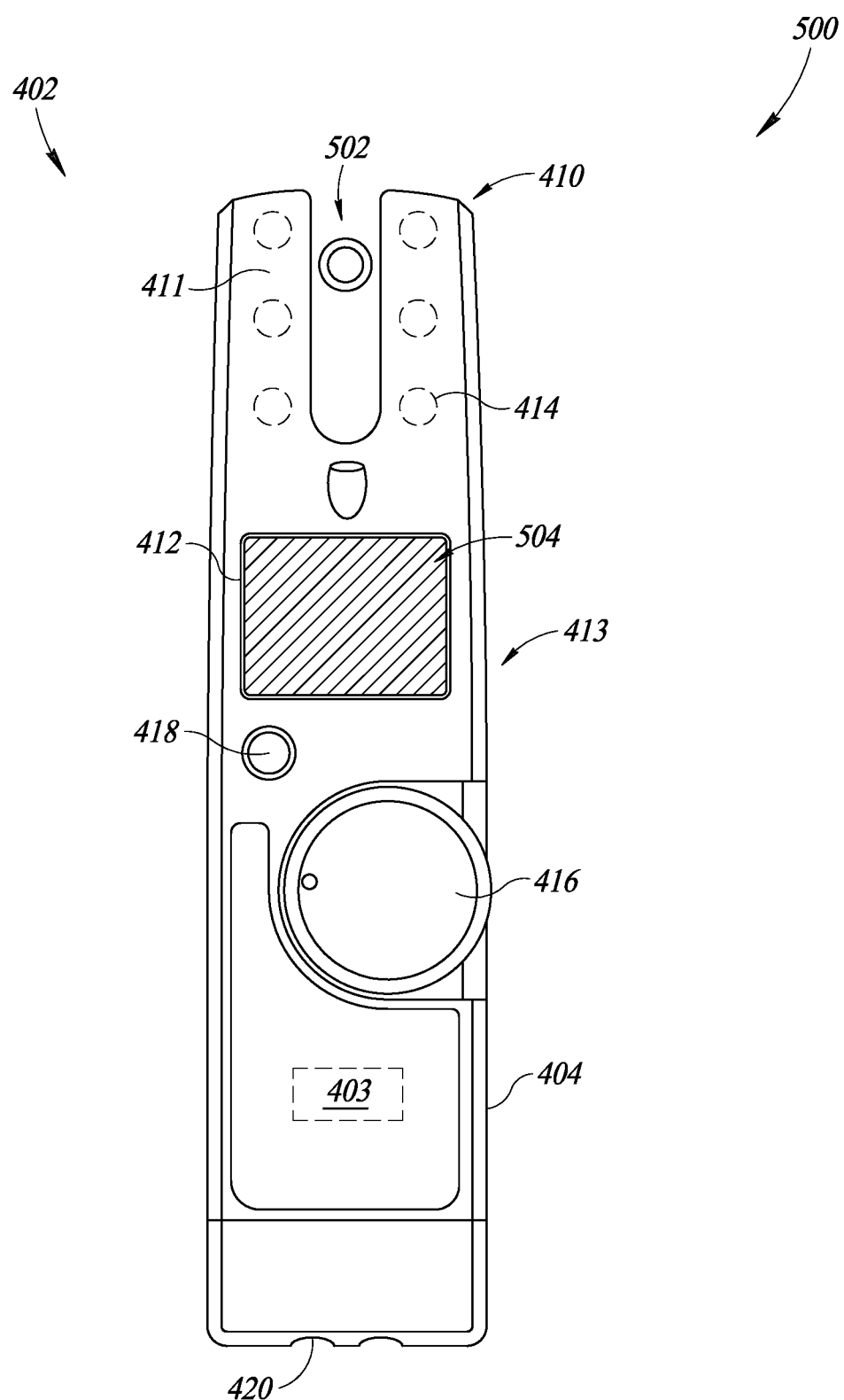
FIG. 5 is a front view of the measurement device of FIG. 4 having a display operating in a first operating mode.

FIG. 5 shows an environment 500 in which the measurement device 402 is operated to detect the presence of certain conditions in an element under test. In response to detecting the presence of a condition or conditions in the element under test, internal circuitry 403 of the measurement device 402 causes the device 402 to operate the display 412 in various operating modes as described herein. One or more of the various operating modes have display characteristics different than the display characteristics of an operating mode of the measurement device 402 in which measurement waveforms or alphanumeric values are presented on the display 412, regardless of the content of the measurement waveforms or alphanumeric values. The measurement device 402 shown in FIG. 5 includes the housing 408, the display 412 that displays information regarding measurement results, and a sensing portion 410 for non-contact measurement of an element to be tested, such as an insulated wire. The sensing portion 410 of the measurement device 402 is provided at a front-end of the housing 408 and includes a pair of elongated members 411 extending outwardly from a main portion 413 of the housing 408. The members 411 and the housing 408 form a single unitary structure. The insulated wire under test may be received between the pair of elongated members 411 during a measurement procedure. The sensing portion 410 may have different configurations in other embodiments, as described elsewhere herein.

A set of sensors 414 may be provided in the sensing portion 410 for sensing electrical characteristics of an electric signal in the insulated wire under test. The set of sensors 414 may include a voltage sensor that, in operation, senses voltage in the insulated wire without galvanically contacting the insulated wire, and may include a current sensor that, in operation, senses a current in the insulated wire without galvanically contacting the insulated wire. The set of sensors 414 may be configured to measure and/or derive various electrical characteristics, including, but not limited to, AC voltage, AC current, DC voltage, resistance, frequency, phase, real power (in Watts (W)), kilowatt-hours (KWh), volt-amperes (VA), volt-amperes reactive (VAR), power factor (PF), total harmonic distortion (THD), inrush current, phase sequence, and voltage drop. The set of sensors 414 may be embedded within the housing 408 such that surfaces of the set of sensors 414 are not visible from the exterior of the measurement device 402.

The measurement device 402 includes a selector dial 416 that a user may interact with to select a measurement mode of or otherwise operate the measurement device 402. The measurement device 402 may also include an input device 418 to initiate a measurement via the sensing portion 410. The measurement device 402 may include one or more ports 420 for connecting supplemental probes, sensors, etc. for contact or non-contact measurements.

The internal circuitry 403 of the measurement device 402, in operation, transitions an operating mode of the display 412 based on detection of a defined condition in an element being tested, such as an insulated wire. More particularly, the measurement device 402 is operated by the operator 404 (see FIG. 4) to perform a set of non-contact measurements of an insulated conductor 502 for detecting the presence of various defined conditions in the insulated conductor 502 related to an electrical characteristic. As an example, measurement device 402 operates the display 412 in an operating mode of a plurality of operating modes based on the measured voltage in the insulated conductor 502. The internal circuitry 403 obtains a set of non-contact voltage measurements by the set of sensors 414 of the insulated conductor 502 and may process the set of voltage measurements to obtain a processed measurement result for the voltage measurement.

In this particular example, the internal circuitry 403 determines an operating mode of the display 412 based on the set of voltage measurements. Each operating mode may have operating mode data associated therewith (e.g., in memory of the measurement device 402), such as a defined voltage range of a plurality of voltage ranges. For example, a first voltage range between 0V and 1V may be associated with a first operating mode, a second voltage range between 1V and 120V may be associated with a second operating mode, and a third voltage range between 120V and 250V may be associated with a third operating mode. The internal circuitry 403 identifies which defined voltage range that the set of voltage measurements in the insulated conductor 502 is within.

With reference to FIG. 5, the internal circuitry 403 determines, based on a set of measurements from one or more of the set of sensors 414, that a voltage of the insulated conductor 502 is within the first voltage range (e.g., 0V to 1V). In response, the display 412 is operated in a first operating mode 504, which is associated with the first voltage range. The first operating mode 504 may a mode in which the display 412 emits or reflects no light or a low luminance level. In some embodiments, the display 412 operating in the first operating mode 504 may emit or reflect light of a first color (e.g., white light, red light), or emit or reflect light in a first flashing pattern, as described with respect to FIG. 2 and elsewhere herein.

Figure 6:
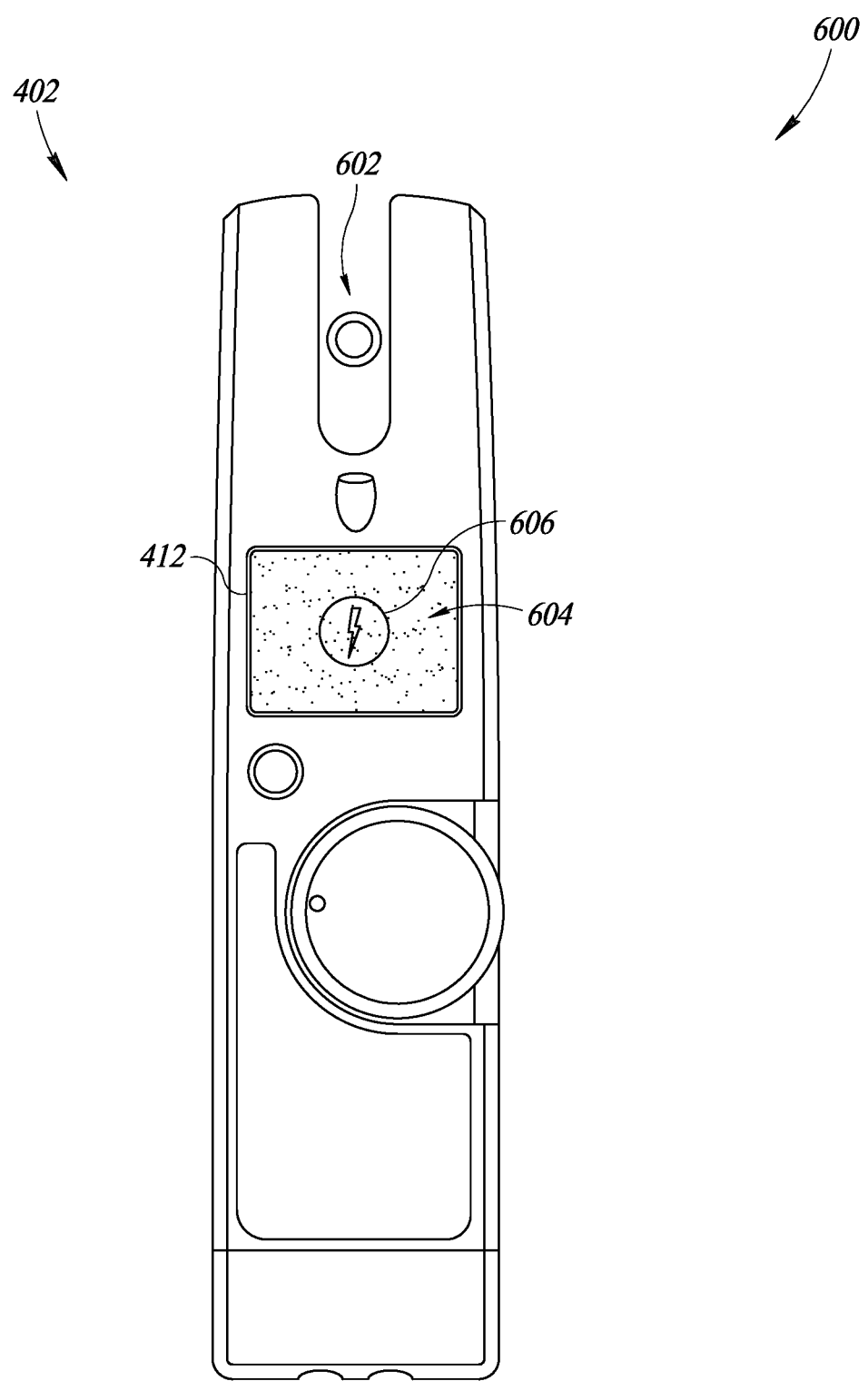
FIG. 6 is a front view of the measurement device of FIG. 4 having a display operating in a second operating mode.

FIG. 6 shows an environment 600 in which the measurement device 402 is operated to detect the presence of certain electrical conditions in an element under test. In this case, based on the set of measurements received, the internal circuitry 403 determines that a voltage of the insulated conductor 602 is within a second voltage range, for example, between 1V and 120V. As a result of determining that the voltage in the insulated conductor 602 is within the second voltage range, the display 412 is operated in a second operating mode 604.

In the second operating mode, the display 412 may be operated to emit or reflect light at a second luminance level higher than the first luminance level of the first operating mode 504. The second luminance level may be a luminance level of greater visibility to the operator 404. In some embodiments, the second operating mode 604 may be one in which the display 412 emits or reflects light of a second, different color (e.g., green light) or emits or reflects light in a second, different flashing pattern. In some embodiments, operation in the second operating mode 604 may also cause the display 412 to display a design pattern or symbol 606 representative of a condition associated with the second voltage range. For instance, the design pattern or symbol 606 may be a lightning bolt or other symbol indicating that the voltage in the insulated conductor 602 is within a certain voltage range (e.g., between 1V and 240V).

Figure 7:
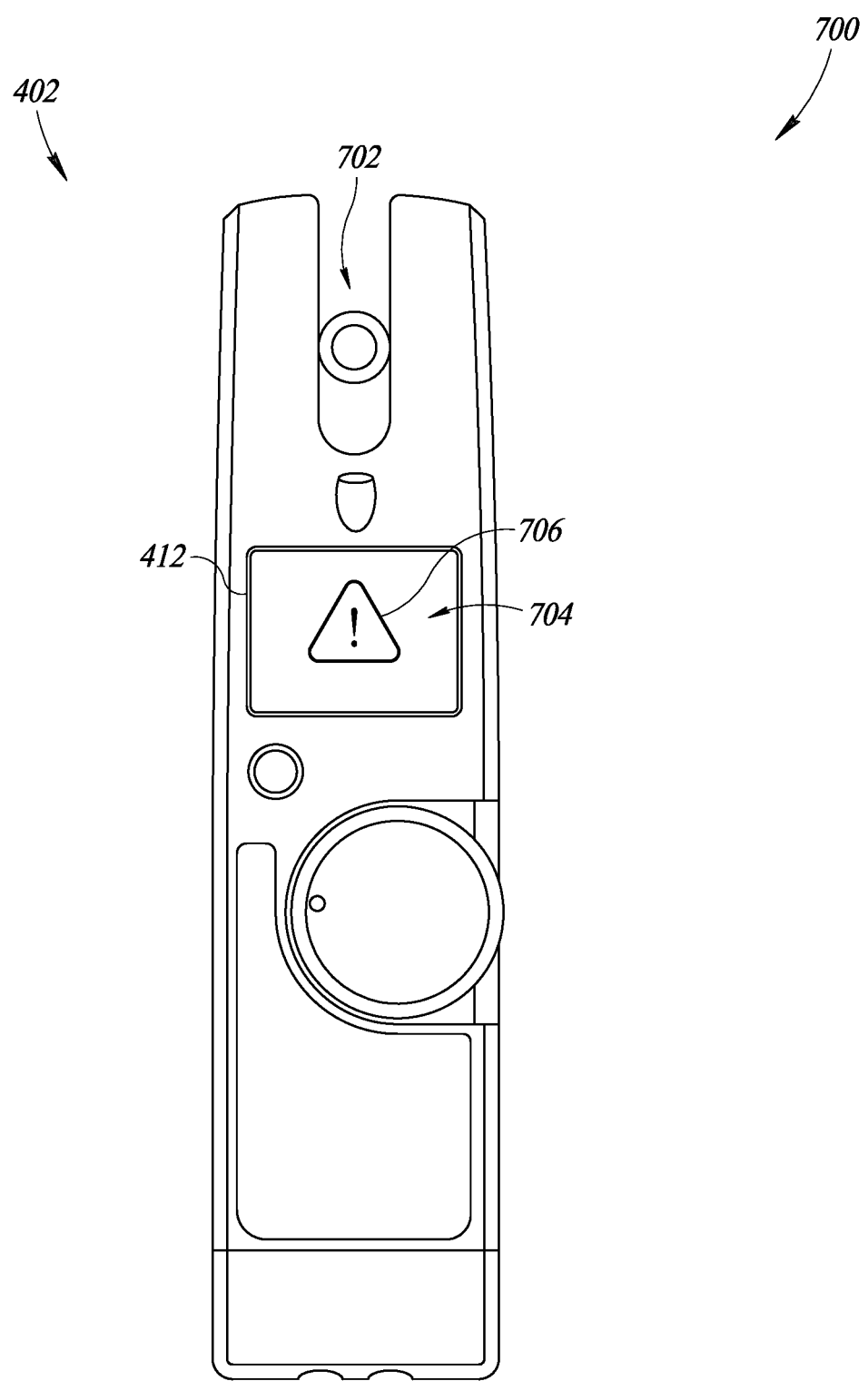
FIG. 7 is a front view of the measurement device of FIG. 4 having a display operating in a first operating mode.

FIG. 7 shows an environment 700 in which the measurement device 402 is operated to detect the presence of certain electrical conditions in an element under test. In this case, based on the set of measurements received, the internal circuitry 403 determines that a voltage of the insulated conductor 702 is within a third voltage range, for example, between 120V and 250V. As a result of determining that the voltage in the insulated conductor 702 is within the third voltage range, the display 412 is operated in a third operating mode 704.

In the third operating mode, the display 412 may be operated to emit or reflect light at a third luminance level higher than the first and second luminance levels described herein. The third luminance level may be a luminance level that is highly visible to the operator 404. In some embodiments, the third operating mode 704 may be one in which the display 412 emits or reflects light of a third, different color (e.g., blue light) or emits or reflects light in a third, different flashing pattern.

In some embodiments, operation in the third operating mode 704 may also cause the display 412 to display a design pattern or symbol 706 representative of a condition associated with the third voltage range. The design pattern or symbol 706 may be, for example, an alert symbol indicating that the voltage level of the insulated conductor 702 is potentially dangerous.

In some embodiments, each of the first, second, and third operating modes 506, 604, and 704 of the display 412 may have a unique illumination attribute. For instance, in the first operating mode 506, the display 412 may not emit or reflect light; in the second operating mode 604, the display 412 may emit or reflect light continuously; and in the third operating mode 704, the display 412 may be controlled between alternating periods of continuous light emission or reflection and discontinuous light emission or reflection (e.g., flashing on and off). The illumination attributes of each operating mode associated with a corresponding electrical condition may be modified by the operator 404, which can help to facilitate accurate discernment of one or more operating modes of the display 412 in problematic lighting conditions.

The defined conditions associated with an operating mode of the display may involve electrical characteristics other than voltage. Such electrical characteristics may include, by way of example, current, direction of current flow, resistance, frequency, phase, real power (in Watts (W)), kilowatt-hours (KWh), volt-amperes (VA), volt-amperes reactive (VAR), power factor (PF), total harmonic distortion (THD), inrush current, phase sequence, and voltage drop. The operating mode of the display 412 may be controlled based on measurements received regarding one or more of the foregoing electrical characteristics.

Figure 8:
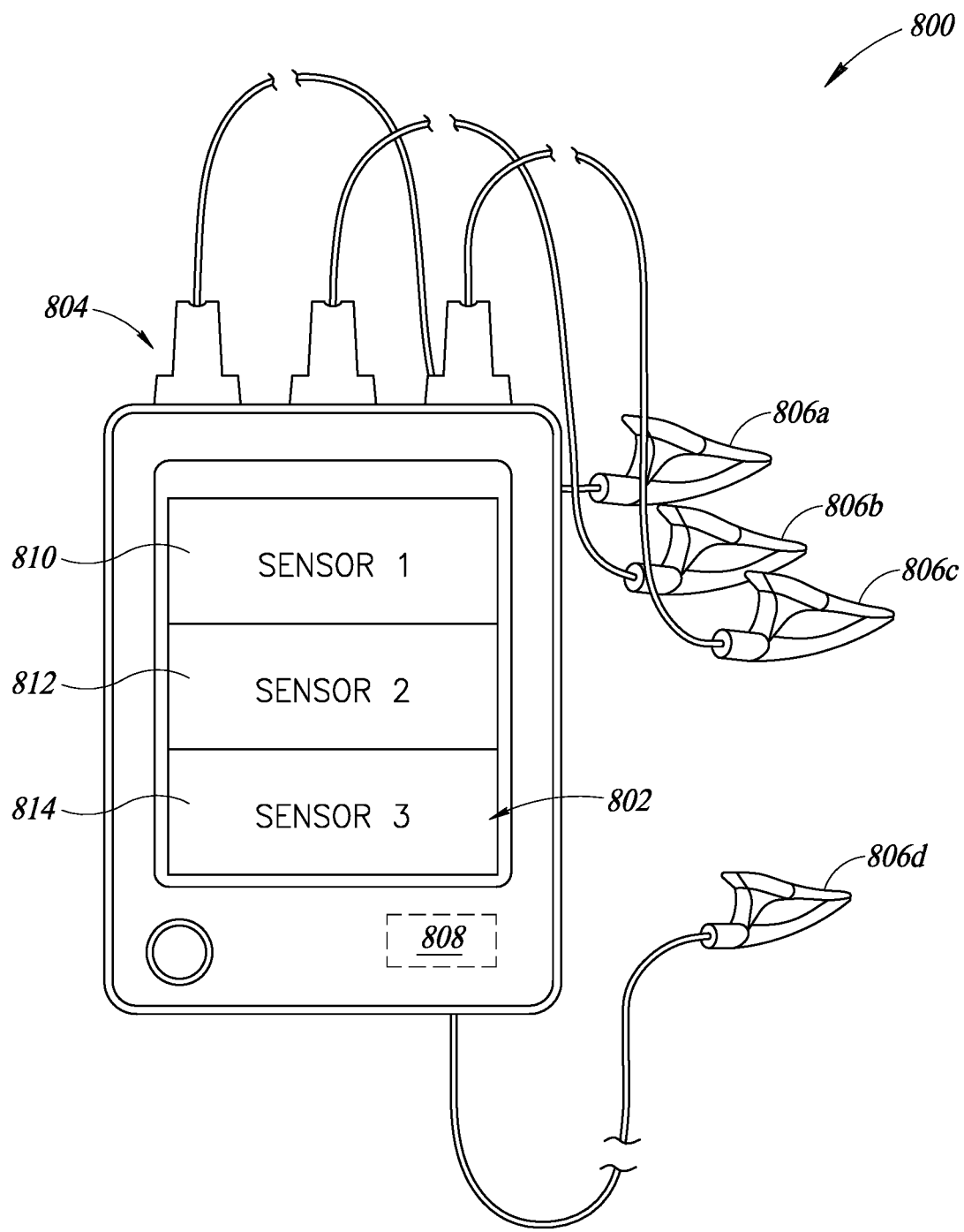
FIG. 8 is a front view of a measurement system that is operable to measure electrical characteristics of an element under test according to one or more embodiments.

In some embodiments, different regions of a display of a measurement device may be operated based on measurements received from different sensor devices or test probes. FIG. 8 shows a measurement device 800 having a display 802 and having multiple input terminals 804 for connection of multiple sensor devices or test probes 806a, 806b, 806c. The measurement device 800 includes internal circuitry 808 configured to process measurements by the test probes 806a, 806b, 806c and control operating modes of the display 802 based on evaluation of whether the measurements satisfy certain conditions associated with electrical characteristics. A test probe 806d may be provided as a ground for use as a reference signal for measurements obtained by the test probes 806a, 806b, 806c.

The internal circuitry 808 may be configured to independently control operating modes of different regions of the display 802. The internal circuitry 808 may control, based on measurements received from the test probes 806a, 806b, 806c, an operating mode of a first region 810 of the display 802, control an operating mode of a second region 812 of the display 802, and control an operating mode of a third region 814 of the display 802. Each of the first region 810, the second region 812, and the third region 814 may be assigned to correspond to one of the test probes 806a, 806b, 806c. An operating mode of the first region 810 may be controlled based on measurements by the test probe 806a, an operating mode of the second region 812 may be controlled based on measurements by the test probe 806b, and an operating mode of the third region 814 may be controlled based on measurements by the test probe 806c.

The operating modes of the first, second, and third regions 810, 812, and 814 may be controlled based on whether the corresponding measurements from the test probes 806a, 806b, and 806c satisfy defined conditions that are associated with each of the regions 810, 812, and 814. In some implementations, the first, second, and third regions 810, 812, and 814 may each be controlled based on different electrical characteristics of the element under test. For example, an operating mode of the first region 810 may be controlled based on voltage measurements by the test probe 806a and an operating mode of the second region 812 may be controlled based on current measurements by the test probe 806b. The defined conditions for each of the first, second, and third regions 810, 812, and 814, as well as the operating modes to be implemented as a result of detection of the defined conditions, may be configured by an operator. Text or visual representations of the correspondence of the first, second, and third regions 810, 812, and 814 to the test probes 806a, 806b, and 806c may be indicated on the display 802. The potential operating modes of the first, second, and third regions 810, 812, and 814 (e.g., the use of different illumination levels, color, or flashing modes) are described elsewhere herein.

Figure 9:
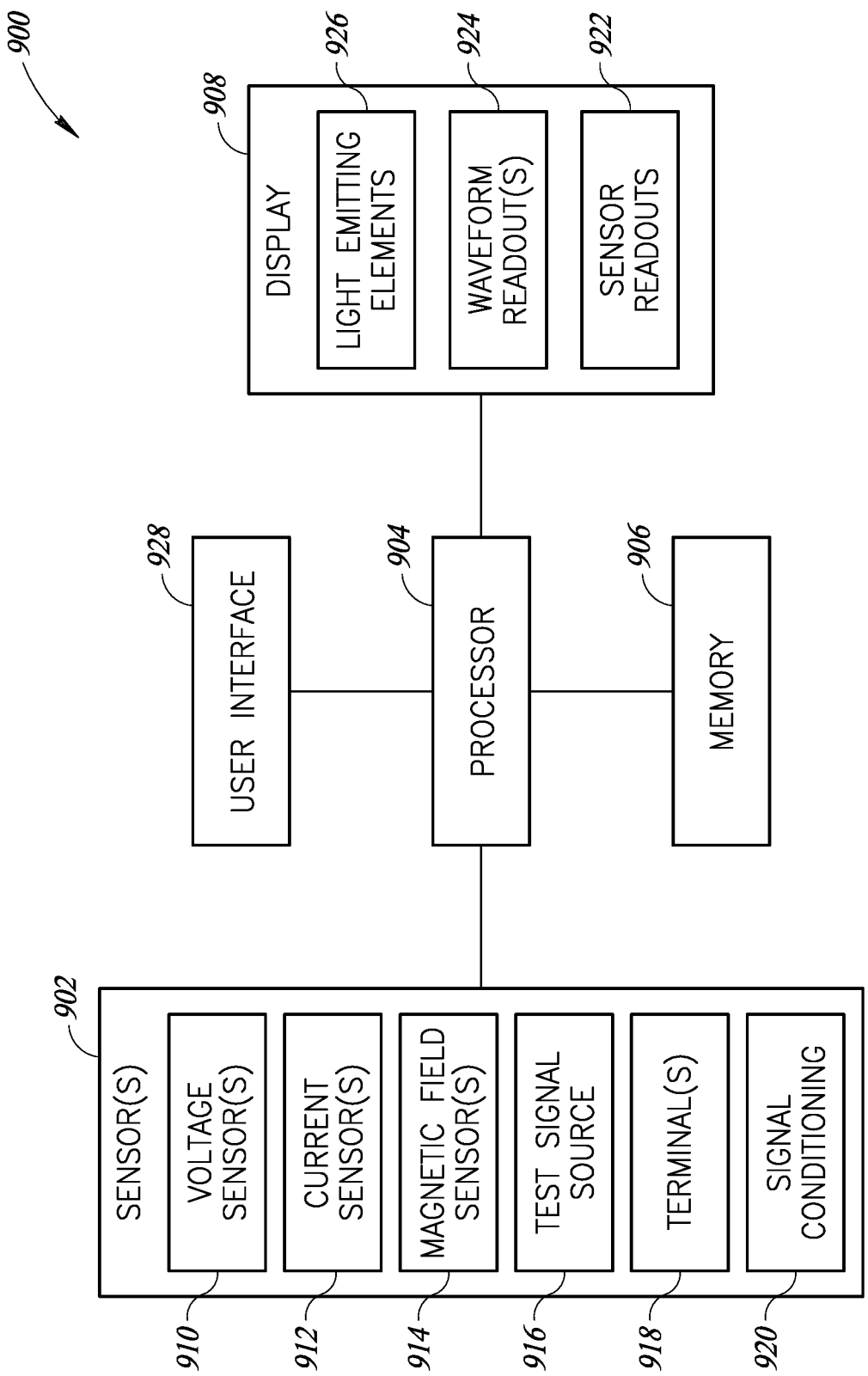
FIG. 9 is a schematic block diagram of a measurement system according to one or more embodiments herein.

FIG. 9 shows a schematic block diagram of a measurement system 900 for controlling display operating modes based on measurements of electrical characteristics according to one or more embodiments. The measurement system 900 may include one or more sensor devices 902 communicatively coupled to processing circuitry of one or more processors 904.

The processor(s) 904 (individually or collectively referred to herein as "the processor 904") may include one or more logic processing units, such as one or more central processing units (CPUs), microprocessors, digital signal processors (DSPs), application-specific integrated circuits (ASICs), field programmable gate arrays (FPGAs), etc. The measurement system 900 may also include memory 906 communicatively coupled to the processor 904 that stores data, such as operating mode data, and/or instructions thereon. The instructions, as a result of execution by the processor 904, may cause the processor 904 to perform operations described herein. In some embodiments, at least one processor 904 may be part of a controller that includes non-transitory processor-readable storage media (e.g., memory 906) communicatively coupled to the at least one processor. The memory 906 may include one or more solid state memories, for instance flash memory (e.g., erasable programmable read-only memory) or solid state drive (SSD), which provide nonvolatile storage of computer-readable instructions, data structures, program modules and other data for the measurement system 900. Although not depicted, the measurement system 900 can employ other non-transitory computer- or processor-readable media, such as a hard disk drive, an optical disk drive, or memory card media drive.

The measurement system 900 also includes a display 908 communicatively coupled with one or more of the processors 904. An operating mode of the display 908 is controllable via communicative coupling with the one or more of the processors 904. The processor 904 is configured to send, in some operating modes, signals causing the display 908 to display content according to the set of measurements obtained during the measurement time interval. Examples of the display 908 include a liquid crystalline display (LCD) device, a light emitting diode (LED) device, and/or an organic light emitting diode (OLED) device. The measurement system 900 receives measurements from one or more sensor devices and controls an operating mode of a display 908 based on the measurements, as described herein.

The memory 906 may store condition data, or criteria, regarding defined conditions of electrical characteristics to be measured by the sensor devices 902. The condition data may indicate defined ranges of measured values of electrical characteristics that, if detected in an element under test, indicate the presence of the defined condition. For instance, the condition data may specify values of a first voltage range (e.g., 0V to 1V), values of a second voltage range (e.g., 1V to 120V), and values of a third voltage range (e.g., 120V to 250V). Alternatively or in addition, the memory 906 may store operating mode data that indicates one or more display attributes associated with each operating mode, for example, a value representative of an illumination level of an operating mode, or a value representative of a light color of an operating mode. Sets of condition data may be associated with corresponding sets of operating mode data in the memory 906 such that a determination that a defined condition of a set of condition data is satisfied causes the associated operation mode data to be implemented as an operating mode of the display 908.

The sensor devices 902 may include various types of sensors for detecting electrical characteristics described herein, such as voltage sensors 910, current sensors 912, and magnetic field sensors 914, by way of example. The voltage sensor(s) 910 may include one or more types of voltage sensors, such as a capacitive divider type voltage sensor, a reference signal type voltage sensor, and a multi-capacitor type voltage sensor. In a measurement system 900 implementing a capacitive divider type voltage sensor, the measurement system 900 operates to generate a variable capacitive voltage between an insulated conductor under test and earth ground. During measurement, the measurement system 900 varies the capacitance of the variable capacitance subsystem to change the impedance of a capacitive divider circuit between the insulated conductor under test and earth ground. By sequentially making two or more measurements across the variable capacitance subsystem, the voltage of the insulated conductor can be determined without requiring any galvanic connection to the insulated conductor.

In a measurement system 900 implementing a reference signal type voltage sensor, the measurement system 900, in operation, senses a reference signal in the insulated wire without galvanically contacting the insulated wire. The one or more processors 904 receives the reference signal and determines an electrical characteristic of the current flowing through the insulated wire based at least in part on the received reference signal.

In a measurement system 900 implementing a multi-capacitor type voltage sensor, the measurement system 900 includes a plurality of sensors that each has a different characteristic that affects capacitive coupling. When capacitively coupled with a conductor of the insulated wire under test, a different voltage is detected at each of the sensors, which can be used to accurately determine the voltage in the insulated wire.

Examples of types of the current sensor 912 include inductive sensors and magnetic field sensors, such as anisotropic magnetoresistive (AMR) sensors, giant magnetoresistive (GMR) sensors, fluxgate sensors, squid sensors, fiber-optic sensors, optically pumped sensors, nuclear procession sensors, search-coil sensors, magnetotransistor sensors, magnetodiode sensors, magneto-optical sensors, Hall effect sensors, Rogowski coils, current transformers, or other types of magnetic field sensors.

The sensor devices 902 may also include a test signal source 916 that is operable in connection with certain measurement operations (e.g., capacitance measurements, resistance measurements) to apply known test signals via a test probe to determine a measured value of an element under test. The sensor devices 902 include, at least in some embodiments, one or more terminals 918 for selective connection and disconnection of sensor devices or test probes to the measurement system 900 for obtaining measurements of an element under test. The sensor devices 902 may include signal conditioning circuitry 920 for amplifying, attenuating, filtering, limiting, processing, isolating, or otherwise manipulating signals transmitted or received via the sensor devices 902 to facilitate effective and accurate measurement of an electrical characteristic.

The processor 904 is configured to cause the display 910 to present a variety of information to a user. The display 910 may display sensor readouts 922 presenting values for the set of measurements obtained from the sensor devices 902. The values presented by the sensor readouts 922 may indicate a single measurement taken at an instant in time or a representative measurement indicative of multiple measurements taken over a period of time, such as an average or a mean of multiple measurements. The sensor readouts 922 may indicate, for example, one or more values selected from a voltage amplitude, a current amplitude, frequency, and power. The measurement system 900 may be configured to display values measured for other electrical characteristics via measurements obtained using the terminal(s) 918 in some embodiments. The processor 904 may also be configured to cause the display 908 to display a waveform representative of an electrical characteristic over time of an element under test.

In accordance with at least one example of the present disclosure, the display 908 includes light emitting elements 926 that the processor 904 may control to implement various operating modes of the display 908. Various attributes of the light emitting elements 926 may be controlled, such as the luminance (e.g., brightness), color, and state of power. The light emitting elements 926 may be controlled individually, collectively, or in subsets. The light emitting elements 926 may include or have associated therewith light modulating elements for modulating the light emitted by the display 908.

The measurement system 900 may include one or more user interfaces 928 that include input devices, such as the selector switch 108 that may be manipulated by an operator to select a measurement mode of the measurement system 900 and other operating parameters. The one or more user interfaces 928 may include other buttons, dials, switches, etc., that affect operation of the measurement system 900. The user interface 320 may include a touch screen, which may be any type of touch screen currently known or later developed. For example, the touch screen may be a capacitive, infrared, resistive, or surface acoustic wave (SAW) device.

In one particular example, the measurement system 900 may be configured to obtain three-phase measurements of systems implementing three-phase power. In some embodiments, the measurement system 900 may obtain measurements concurrently from three insulated wires of a three-phase power system, or alternatively the measurement system 900 may sequentially obtain measurements from each of the three insulated wires of the three-phase power system. For instance, the measurement system may take first measurements of a first electric signal in a first wire, then take second measurements of a second electric signal in a second wire, and then take third measurements of a third electric signal in a third wire. The measurement system may then correlate the first, second, and third measurements with each other to determine relationships therebetween, such as phase relationships between the electric signals in the three wires or amplitude relationships between the electric signals in the three wires.

In some embodiments, the measurement system 900 may include multiple adjustable sensing portions and be configured to simultaneously measure the electric signals of a three-phase power system. In such embodiments, different display operating modes of the measurement system 900 may be associated with different electrical conditions involving three-phase power measurements. As an example, the measurement system 900 may transition the display 908 to a different operating mode (e.g., higher illuminance display mode) as a result of determining that a root-mean-square (RMS) value of voltage or current in a three-phase system under test satisfies a defined set of criteria associated with an electrical condition. As another example, the measurement system 900 may transition the display 908 to a different operating mode (e.g., higher illuminance display mode) as a result of determining the presence of defined phase relationships in the three-phase system under test, for example, that the phase relationships between elements under test the three-phase power system are within an expected range of phases or that the current-voltage phase relationship in each element is within an expected range of phases. Each element of a three-phase system under test may be associated with a corresponding region of the display 908, for example, the first, section, and third regions 810, 812, and 814 described with respect to FIG. 8.

Figure 10:
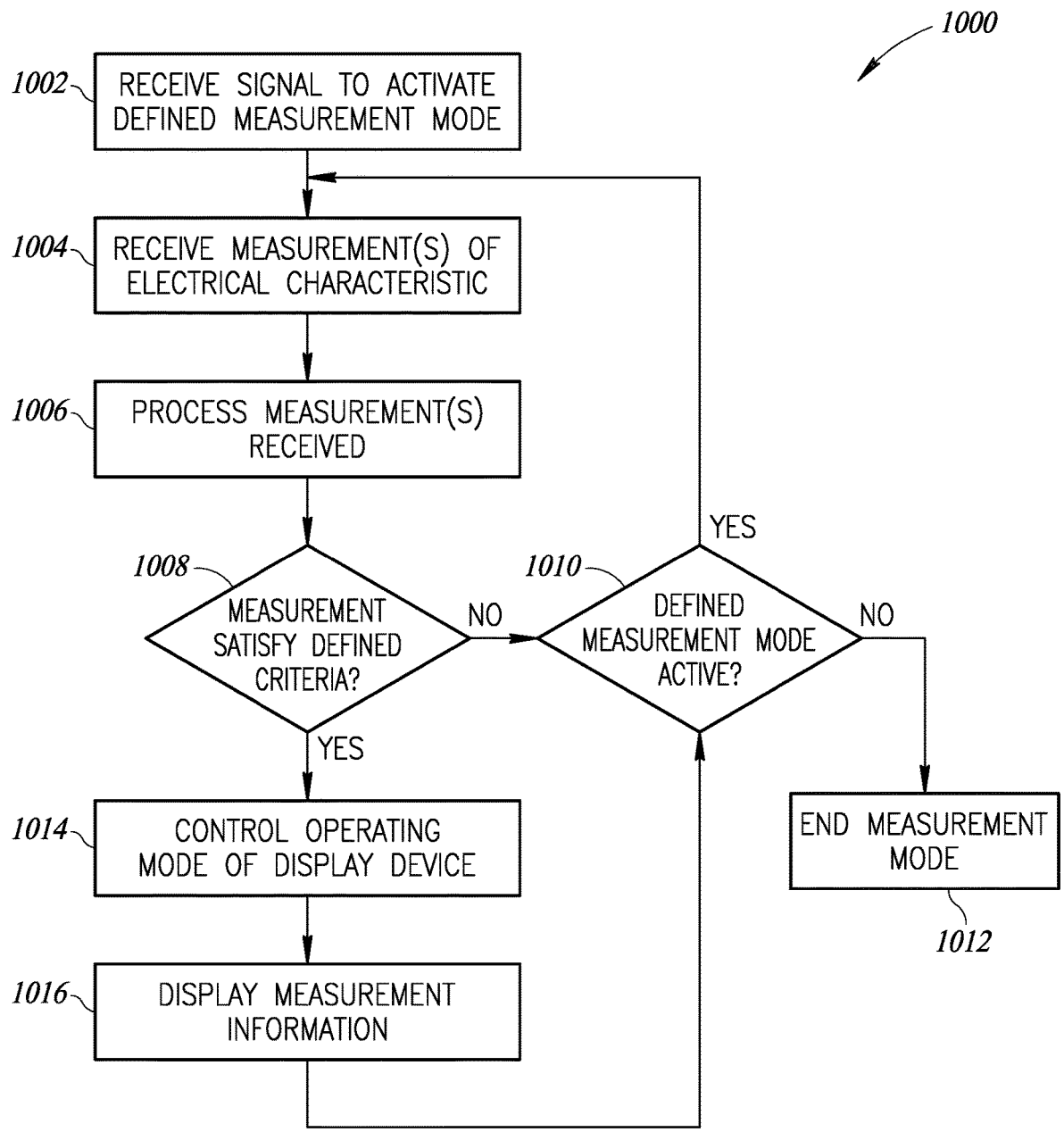
FIG. 10 is a flowchart of an operating method of a measurement system of FIG. 9.

FIG. 10 shows a method 1000 of operating a measurement system or device according to one or more embodiments described herein. The method 1000 may be performed by one or more appropriate devices, systems, or components described herein, such as the processor 904 in connection with operation of the display 908. The method 1000 begins by receiving, at 1002, a signal from a user input device to activate a defined measurement mode. The signal may be generated as a result of a position of the selector switch 108 (FIGS. 1-3) and the measurement system being in an active powered-on state. Examples of defined measurement modes include continuity testing mode, voltage range testing mode, current range testing mode, frequency range testing mode, current flow direction testing mode, and insulation testing mode. The processor 904 may modify certain operational attributes of the measurement device based on the measurement mode selected.

The method 1000 also includes receiving, at 1004, from one or more sensor devices or test probes, a set of measurements regarding an electrical characteristic of an element under test. In some measurement modes, the set of measurements received in 1004 may be a single measurement obtained from a first test probe and a single measurement from a second probe. In some measurement modes, the set of measurements received may include multiple measurements obtained by a first test probe over a period of time and multiple measurements obtained by a second probe over the same period of time. In some measurement modes, the set of measurements received in 1004 may be multiple measurements obtained by a single test probe over a period of time or a single measurement obtained by the single test probe.

The method 1000 includes processing, at 1006, the set of measurements received in 1004 to generate a processed measurement result. The processed measurement result in 1006 may be a result generated based on one or more mathematic operations performed involving the set of measurements. For instance, the processed measurement result may be based on a difference calculated between a measurement during a given time period by a first test probe and a measurement during the given time period by a second test probe. In some embodiments, the processed measurement result may be based on one or more representative values calculated based on multiple measurements by the first test probe and/or the second test probe. In some embodiments, the processed measurement result may be calculated as a representative value of an electrical characteristic using multiple measurements obtained by one or more test probes. For instance, processing 1006 may involve calculating a resistance between test points based on a difference between detected voltages at the test points relative to a test current applied between the test points.

Processing 1006, in some implementations, may involve calculating a first average value of multiple measurements obtained by a first test probe and calculating a second average value of multiple measurements obtained by a second test probe. The processed measurement result may then be calculated as a difference between the first average value and the second average value. Other representative values than an average may be used during processing 1006 the set of measurements, such as a mean value (e.g., root-mean square value) or a median value of the set of measurements or subsets thereof.

In 1008, the processor 904 determines which, if any, defined conditions related to an electrical characteristic are satisfied by the set of measurements or the processed measurement result(s). The processor 904 may determine which defined conditions are applicable based on a measurement mode of the measurement system 900, such as defined voltage value ranges, defined current ranges, and defined resistance value ranges, by way of example. Alternatively, threshold values may be used as applicable criteria for the defined conditions. The processor 904 compares the set of measurements or the processed measurement results to the criteria or conditions applicable.

If, in 1008, it is determined that the set of measurements do not satisfy a defined criteria, the method 1000 proceeds to determine 1010 whether the defined measurement mode is active. For instance, the processor 904 may determine whether a particular input device (e.g., a button) is being depressed by an operator. If so, the method 1000 returns to 1004 to obtain or receive 1004 measurement(s) of the electrical characteristic of the element under test.

If, in 1008, it is determined that the set of measurements satisfy a defined condition, the method 1000 proceeds to controlling, at 1014, an operating mode of the display 908. Controlling 1014 the operating mode may involve maintaining a current operating mode of the display 908 if the defined condition satisfied by the current set of measurements is the same condition satisfied by a preceding set of measurements. Controlling 1014 the operating mode may involve transitioning a current operating mode of the display 908 to a different operating mode as a result of determining that the defined condition satisfied by the current set of measurements is a different condition than satisfied by the preceding set of measurements.

As a particular example, the measurement device 900 may be in a measurement mode for detecting electrical continuity between two test points, as described with respect to FIG. 1 and elsewhere herein. In 1014, the processor 904 may determine that a set of measurements by the sensor devices 902 satisfy a defined criteria for electrical continuity, for instance, that a difference between measurements by a pair of test probes is less than a defined resistance threshold for detection of electrical continuity in a circuit under test. As a result, the processor 904 causes the display 908 to transition from a current operating mode in which the light-emitting elements 926 do not emit light to a different operating mode in which the light-emitting elements 926 emit light having a certain illumination level and/or color. The processor 904 may continue to control the display device 908 to be maintained in the selected operating mode until a different defined condition is satisfied or the measurement system 900 is no longer in an active measurement mode. As described elsewhere herein, various light-emitting attributes of the display 908 may be controlled based on the operating mode corresponding to the defined condition, such as an illumination level, a color, or a flashing pattern.

The method 1000 may include displaying 1016, in connection with controlling 1014 the operating mode of the display 908, measurement information regarding the set of measurements. The measurement information displayed may include numerical values representative of the set of measurements (e.g., a measured voltage level, a measured resistance level) or a waveform representative of measurements obtained over time of a notch characteristic.

The method 1000 proceeds to 1010 to determine whether the defined measurement mode is still active. Various portions of the method 1000 may be repeated if the measurement mode of the measurement system 900 is still active. If the processor 904 determines that the measurement mode of the measurement system 900 is inactive at 1010, the processor 904 ends 1012 the measurement mode. The measurement mode of the measurement system 900 may be determined as being inactive if, for example, the input device 418 is not currently depressed by the operator 404 or if the selector dial 416 is changed to select a different measurement mode.

Some embodiments of the present disclosure may comprise computer program products. For example, according to one embodiment there is provided a computer readable medium comprising a computer program adapted to perform one or more of the methods or functions described above. The medium may be a physical storage medium, such as for example a Read Only Memory (ROM) chip, or a disk such as a Digital Versatile Disk (DVD-ROM), Compact Disk (CD-ROM), a hard disk, a memory, a network, or a portable media article to be read by an appropriate drive or via an appropriate connection, including as encoded in one or more barcodes or other related codes stored on one or more such computer-readable mediums and being readable by an appropriate reader device.

Furthermore, in some embodiments, some or all of the methods and/or functionality may be implemented or provided in other manners, such as at least partially in firmware and/or hardware, including, but not limited to, one or more application-specific integrated circuits (ASICs), digital signal processors, discrete circuitry, logic gates, standard integrated circuits, controllers (e.g., by executing appropriate instructions, convolutional accelerators, and including microcontrollers and/or embedded controllers), field-programmable gate arrays (FPGAs), complex programmable logic devices (CPLDs), etc., and various combinations thereof.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A measurement device, comprising:
    a housing sized and shaped to be held in a hand;
    a display supported by the housing, the display including a display screen configured to display measurement values; and
    processing circuitry operatively coupled to the display and to one or more sensor devices for obtaining measurements of electrical characteristics of an element under test, wherein the processing circuitry is configured to:
        operate the display in a first operating mode in which the display screen has a first illumination characteristic;
        receive a measurement obtained by the one or more sensor devices;
        determine whether the measurement satisfies a criterion for detecting an electrical condition in the element under test; and
        as a result of determining that the measurement satisfies the criterion, transition an operation of the display from the first operating mode to a second operating mode in which the display screen has a second illumination characteristic that is different than the first illumination characteristic of the first operating mode,
    wherein in the second operating mode, the display screen is configured to display a measurement value of the measurement, and
    wherein:
        (A) the first and second illumination characteristics are a luminance of light emitted or reflected by the display screen, wherein the display screen has a first luminance in the first operating mode, and the display screen has a second luminance in the second operating mode, the second luminance being different than the first luminance, or
        (B) the first and second illumination characteristics are a flashing pattern of light emitted or reflected by the display screen, wherein the display screen intermittently emits or reflects light in the second operating mode different than emission or reflection of light in the first operating mode.

2. The measurement device of claim 1, wherein the measurement is a first measurement, the criterion is a first criterion, and the electrical condition is a first electrical condition, and
    wherein the processing circuitry is further configured to:
        receive a second measurement obtained by the one or more sensor devices at a time subsequent to receiving the first measurement;
        determine whether the second measurement satisfies a second criterion for detecting a second electrical condition in the element under test; and
        as a result of determining that the second measurement satisfies the second criterion, transition the operation of the display from the second operating mode to a third operating mode in which the display screen has a third illumination characteristic that is different than the second illumination characteristic of the second operating mode.

3. The measurement device of claim 1, wherein the measurement is a first measurement, and the processing circuitry is further configured to:

receive a second measurement obtained by the one or more sensor devices at a time subsequent to receiving the first measurement;

determine whether the second measurement satisfies the criterion for detecting the electrical condition in the element under test; and as a result of determining that the second measurement fails to satisfy the criterion, transition the operation of the display from the second operating mode to the first operating mode in which the display screen has the first illumination characteristic.

4. The measurement device of claim 1, wherein the measurement is a first measurement obtained by a first sensor device of the one or more sensor devices, and the processing circuitry is configured to:

receive a second measurement obtained by a second sensor device of the one or more sensor devices, wherein the second measurement is obtained in connection with the first measurement;

calculate a difference between the first measurement and the second measurement; and determine whether the difference is within a range of values of the criterion, and transition the operation of the display from the first operating mode to the second operating mode in which the display screen has the second illumination characteristic as a result of the difference being within the range of values.

5. The measurement device of claim 1, wherein:

the measurement device is a multimeter, at least one of the first illumination characteristic or the second illumination characteristic indicates a range of measurement values that encompasses the measurement value of the measurement, and the first and second illumination characteristics are not alphanumeric or symbolic representations of a specific measurement value in the range of measurement values.

6. A measurement system, comprising:

one or more sensor devices; and a measurement device that includes:

a display including a display screen configured to display measurement values;

a memory; and a processor operatively coupled to the display, the memory, and the one or more sensor devices, wherein the processor is configured to:

obtain, from the memory, condition data for detecting defined electrical conditions and operating mode data for operating the display based on detection of one or more of the defined electrical conditions;

receive a measurement of an electrical characteristic from the one or more sensor devices;

determine whether the measurement satisfies a criterion specified in the condition data for a defined electrical condition; and as a result of the measurement satisfying the criterion, operate the display in a first operating mode in which the display screen has a first illumination characteristic as specified in the operating mode data for the first operating mode, the first illumination characteristic being different than an illumination characteristic of the display screen when the measurement does not satisfy the criterion, wherein the first operating mode is associated with detection of the defined electrical condition, and wherein:

(A) the first illumination characteristic is a luminance of light emitted or reflected by the display screen, wherein the display screen has a first luminance in the first operating mode that is different than a luminance of the display screen when the measurement does not satisfy the criterion, or (B) the first illumination characteristic is a flashing pattern of light emitted or reflected by the display screen, wherein the display screen intermittently emits or reflects light in the first operating mode in a manner that is different than when the measurement does not satisfy the criterion.

7. The measurement system of claim 6, wherein the measurement is a first measurement, the criterion is a first criterion, and the defined electrical condition is a first defined electrical condition, and the processor is further configured to:

receive a second measurement of an electrical characteristic from the one or more sensor devices;

determine whether the second measurement satisfies a second criterion specified in the condition data for a second defined electrical condition; and as a result of the second measurement satisfying the second criterion, operate the display in a second operating mode in which the display screen has a second illumination characteristic as specified in the operating mode data for the second operating mode, wherein the second operating mode is associated with the second defined electrical condition.

8. The measurement system of claim 7, wherein the second illumination characteristic in the second operating mode is different than the first illumination characteristic in the first operating mode.

9. The measurement system of claim 6, wherein the one or more sensor devices include one or more sensors configured to measure the electrical characteristic of an element under test without galvanically contacting the element under test.

10. A method of operating a measurement device, comprising:

operating, by the measurement device, a display screen in a first operating mode, wherein the display screen is operable to display a measurement value of a measurement made by the measurement device;

receiving, by the measurement device, a first measurement of an electrical characteristic of an element under test, wherein the first measurement is obtained by one or more sensors coupled to the measurement device;

detecting, by the measurement device, a presence of a first defined electrical condition in the element under test based on a relationship of the first measurement to a first criterion; and as a result of detecting the presence of the first defined electrical condition, operating, by the measurement device, the display screen in a second operating mode associated with the first defined electrical condition by causing the display screen to have an illumination characteristic during operation in the second operating mode that is different than an illumination characteristic of the display screen during operation in the first operating mode, wherein:

(A) the illumination characteristics of the display screen during operation in the first and second operating modes are a luminance of light emitted or reflected by the display screen, wherein the display screen has a first luminance in the first operating mode, and the display screen has a second luminance in the second operating mode, the second luminance being different than the first luminance, or (B) the illumination characteristics of the display screen during operation in the first and second operating modes are a flashing pattern of light emitted or reflected by the display screen, wherein the display screen intermittently emits or reflects light in the second operating mode different than emission or reflection of light in the first operating mode.

11. The method of claim 10, wherein detecting the presence of the first defined electrical condition comprises detecting electrical continuity between a first test point in the element under test and a second test point in the element under test, and wherein the first criterion includes a first range of resistance values.

12. The method of claim 10, wherein operating the display screen in the first operating mode includes causing the display screen to have the first luminance, and wherein operating the display screen in the second operating mode includes causing the display screen to have the second luminance that is different than the first luminance.

13. The method of claim 10, wherein operating the display screen in the first operating mode includes causing the display screen to not emit or reflect light, and wherein operating the display screen in the second operating mode includes causing the display screen to emit or reflect light.

14. The method of claim 10, further comprising:
receiving, by the measurement device, a second measurement of an electrical characteristic of the element under test, wherein the second measurement is obtained by the one or more sensors;
detecting, by the measurement device, a presence of a second defined electrical condition in the element under test based on a relationship of the second measurement to a second criterion; and
as a result of detecting the presence of the second defined electrical condition, operating, by the measurement device, the display screen in a third operating mode associated with the second defined electrical condition by causing the display screen to have an illumination characteristic during operation in the third operating mode that is different than the illumination characteristic during operation in the second operating mode.

15. The method of claim 10, further comprising receiving user input that sets the illumination characteristic of the display screen in at least one of the first or second operating modes.

16. The method of claim 10, wherein the measurement is a resistance measurement and the first defined electrical condition is an electrical continuity in the element under test, and wherein the first defined electrical condition is detected by the measurement device as a result of the resistance measurement satisfying the first criterion.

17. The method of claim 10, wherein:
the measurement device is a multimeter,
the illumination characteristic of the display screen of the multimeter indicates a range of measurement values that encompasses a measurement value of the first measurement, and
the illumination characteristic is not an alphanumeric or symbolic representation of a specific measurement value in the range of measurement values.

18. The method of claim 10, further comprising using a backlight of the display screen to provide at least one of the illumination characteristics of the display screen.

* * * * *